US010165688B2

(12) United States Patent
Wang et al.

(10) Patent No.: US 10,165,688 B2
(45) Date of Patent: Dec. 25, 2018

(54) FLEXIBLE ELECTRONIC DEVICE AND FABRICATING METHOD THEREOF

(71) Applicant: Industrial Technology Research Institute, Hsinchu (TW)

(72) Inventors: Sheng-Po Wang, Taoyuan (TW); Heng-Yin Chen, Hsinchu County (TW); Cheng-Chung Lee, Hsinchu (TW); Jia-Chong Ho, Hsinchu County (TW); Yung-Hui Yeh, Hsinchu (TW); Tai-Jui Wang, Kaohsiung (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 15/137,007

(22) Filed: Apr. 25, 2016

(65) Prior Publication Data

US 2017/0020002 A1 Jan. 19, 2017

Related U.S. Application Data

(60) Provisional application No. 62/192,541, filed on Jul. 14, 2015.

(30) Foreign Application Priority Data

Dec. 28, 2015 (TW) .............................. 104144048 A

(51) Int. Cl.
*H05K 1/18* (2006.01)
*H05K 3/00* (2006.01)
(Continued)

(52) U.S. Cl.
CPC ....... *H05K 1/189* (2013.01); *H01L 23/49827* (2013.01); *H05K 3/007* (2013.01);
(Continued)

(58) Field of Classification Search
CPC ..... H05K 1/189; H05K 3/4664; H05K 3/4682
(Continued)

(56) References Cited

U.S. PATENT DOCUMENTS 5,239,448 A * 8/1993 Perkins ............... H01L 23/5385
174/266
5,384,691 A * 1/1995 Neugebauer ............ H01L 23/50
257/700
(Continued)

FOREIGN PATENT DOCUMENTS

CN 202134575 2/2012
CN 203720821 7/2014
(Continued)

OTHER PUBLICATIONS

"Office Action of Taiwan Counterpart Application", dated Feb. 17, 2017, p. 1-p. 6.
(Continued)

*Primary Examiner* — Sherman Ng
(74) *Attorney, Agent, or Firm* — JCIPRNET

(57) ABSTRACT

A flexible electronic device including a first flexible substrate, an electronic component, and a control device is provided. The electronic component includes a conductive layer. The control device includes at least one integrated circuit and a circuit layer set. The circuit layer set includes a plurality of circuit layers and at least one first dielectric layer, and at least a portion of the first dielectric layer is interposed between two adjacent circuit layers. The integrated circuit is electrically connected to the electronic component through the circuit layer set and the conductive layer. At least a portion of the conductive layer and at least a portion of one circuit layer are integrally formed, and the conductive layer and the circuit layer are both disposed on
(Continued)

the first flexible substrate. A fabricating method of a flexible electronic device is also provided.

13 Claims, 27 Drawing Sheets

(51) Int. Cl.
- H05K 3/46 (2006.01)
- H01L 23/498 (2006.01)
- H05K 3/42 (2006.01)
- H05K 1/14 (2006.01)

(52) U.S. Cl.
CPC ............ *H05K 3/429* (2013.01); *H05K 3/4644* (2013.01); *H05K 3/4682* (2013.01); *H05K 1/144* (2013.01); *H05K 2201/10128* (2013.01)

(58) Field of Classification Search
USPC ......... 174/254; 361/749–751, 760, 764, 761, 361/794
See application file for complete search history.

(56) References Cited

U.S. PATENT DOCUMENTS

| | | | |
|---|---|---|---|
| 6,717,821 B2 * | 4/2004 | Miller | H05K 1/023 361/760 |
| 2014/0118969 A1 | 5/2014 | Lee | |
| 2014/0152629 A1 | 6/2014 | So et al. | |
| 2014/0249368 A1 | 9/2014 | Hu et al. | |
| 2014/0306348 A1 | 10/2014 | Ahn | |
| 2014/0332770 A1 | 11/2014 | Im | |

FOREIGN PATENT DOCUMENTS

| | | |
|---|---|---|
| CN | 203748111 | 7/2014 |
| CN | 104053303 | 9/2014 |
| TW | 200726344 | 7/2007 |
| TW | I365524 | 6/2012 |
| TW | 201322833 | 6/2013 |
| TW | 201511249 | 3/2015 |

OTHER PUBLICATIONS

"Office Action of China Counterpart Application," dated May 16, 2018, p. 1-p. 7.

* cited by examiner

FLEXIBLE ELECTRONIC DEVICE AND FABRICATING METHOD THEREOF

CROSS-REFERENCE TO RELATED APPLICATION

This application claims the priority benefits of U.S. provisional application Ser. No. 62/192,541, filed on Jul. 14, 2015 and Taiwan application serial no. 104144048, filed on Dec. 28, 2015. The entirety of each of the above-mentioned patent applications is hereby incorporated by reference herein and made a part of this specification.

TECHNICAL FIELD

The technical field relates to a flexible electronic device and a fabricating method thereof.

BACKGROUND

In general, a flexible electronic device that features light weight, portability, flexibility, and bendability is convenient to use and widely applicable and therefore has great potential for development. After years of development, some flexible electronic products, such as OLED (Organic Light-Emitting Diode) display and EPD (Electronic Paper Display), have been commercialized and become profitable.

In the structure of a general flexible display, the display panel is fabricated on a flexible substrate while other components for controlling the display panel are fabricated on a printed circuit board (PCB). The flexible substrate and the printed circuit board are connected through a flexible printed circuit board (FPCB). Although the flexible substrate has favorable flexibility, the printed circuit board is not flexible and cannot be bent. As a result, the degree of freedom of bending ways of the flexible electronic device are limited. Moreover, the junction between the flexible printed circuit board and the printed circuit board and the junction between the flexible printed circuit board and the flexible substrate have relatively weak structures. Thus, how to enhance the structural strength and improve the degree of freedom of bending ways of the flexible electronic device is an important issue that needs to be addressed in this field.

SUMMARY

According to an embodiment of the disclosure, a flexible electronic device includes a first flexible substrate, an electronic component, and a control device. The first flexible substrate has a surface. The electronic component includes a conductive layer. The control device is disposed on the surface. The control device includes at least one integrated circuit and a circuit layer set. The circuit layer set is disposed between the at least one integrated circuit and the first flexible substrate. The circuit layer set includes a plurality of circuit layers and at least one first dielectric layer, and at least a portion of the at least one first dielectric layer is interposed between two adjacent circuit layers. The integrated circuit is electrically connected to the electronic component through the circuit layer set and the conductive layer. At least a portion of the conductive layer and at least a portion of one circuit layer are integrally formed, and the conductive layer and the one circuit layer are both disposed on the first flexible substrate.

According to an embodiment of the disclosure, a fabricating method of a flexible electronic device includes forming a conductive material layer on a surface of a first flexible substrate. A portion of the conductive material layer is a conductive layer of an electronic component, and another portion of the conductive material layer is one of a plurality of circuit layers of a circuit layer set of a control device. The fabricating method of the flexible electronic device further includes forming the circuit layers of the circuit layer set and at least one first dielectric layer, and at least a portion of the at least one first dielectric layer is interposed between two adjacent circuit layers. The fabricating method of the flexible electronic device also includes electrically connecting at least one integrated circuit of the control device to the electronic component through the circuit layer set and the conductive layer.

Several exemplary embodiments accompanied with figures are described in detail below to further describe the disclosure in details.

BRIEF DESCRIPTION OF THE DRAWINGS

The accompanying drawings are included to provide a further understanding of the disclosure, and are incorporated in and constitute a part of this specification. The drawings illustrate exemplary embodiments and, together with the description, serve to explain the principles of the disclosure.

DESCRIPTION OF THE EMBODIMENTS

Figure 1A:
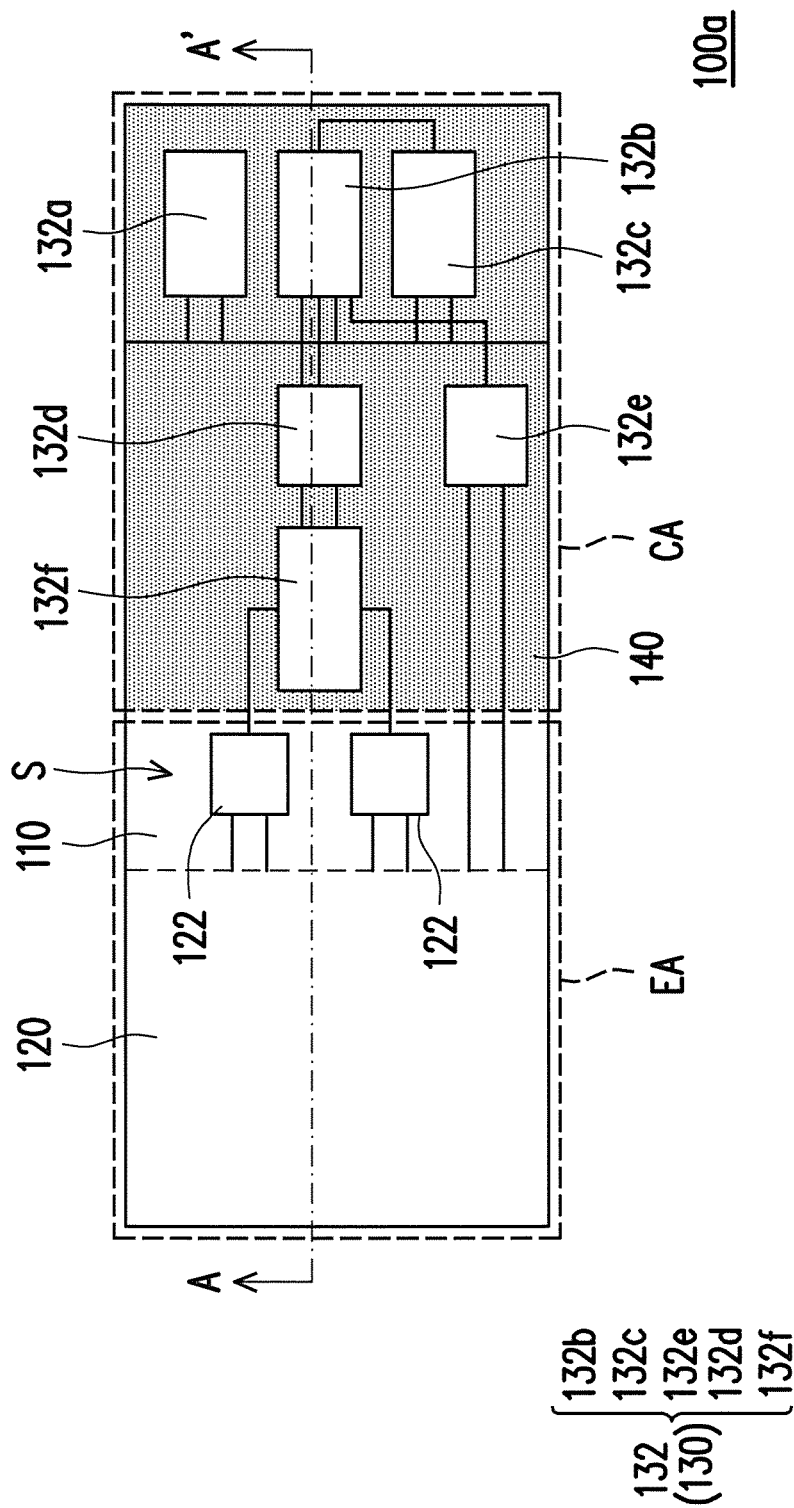
FIG. 1A is a top view of the flexible electronic device according to an embodiment of the disclosure.

FIG. 1A is a top view of a flexible electronic device according to an embodiment of the disclosure. Please refer to FIG. 1A. In this embodiment, a flexible electronic device 100a includes an electronic component 120 and a control device 130. Moreover, the flexible electronic device 100a includes an electronic component area EA and a control device area CA. The electronic component 120 is located in the electronic component area EA and the control device 130 is located in the control device area CA. The electronic component 120 includes a display panel, a touch panel, a sensor, or a combination thereof. In this embodiment, the electronic component 120 is a display panel having a touch function, such as an AMOLED (active-matrix organic light-emitting diode) display panel having a touch function, a PMOLED (passive-matrix organic light-emitting diode) display panel having a touch function, an LCD (liquid crystal display), or other types of display panels. In some embodiments, depending on different applications, the electronic component 120 may also include a sensor. The sensor includes a light sensor, a heat sensor, a chemical sensor, or a combination thereof. Nevertheless, the disclosure is not limited thereto. Furthermore, in this embodiment, the control device 130 includes at least one integrated circuit 132 for driving and controlling the electronic component 120. The integrated circuit 132 includes a central processing unit, a video signal interface, a RF (radio frequency) device, or a combination thereof. Alternatively, the integrated circuit 132 may be other types of integrated circuits, depending on different applications. The flexible electronic device 100a includes a plurality of integrated circuits 132 that include a central processing unit 132b, an RF device 132c, a video signal interface 132d, a touch driving device 132e, and a display driving device 132f. Moreover, a power supply 132a of the flexible electronic device 100a is disposed in the control device area CA. In this embodiment, the components of the control device 130 are electrically connected as appropriate to drive the electronic component 120 to operate or to perform other functions of the flexible electronic device 100a.

Figure 1B:
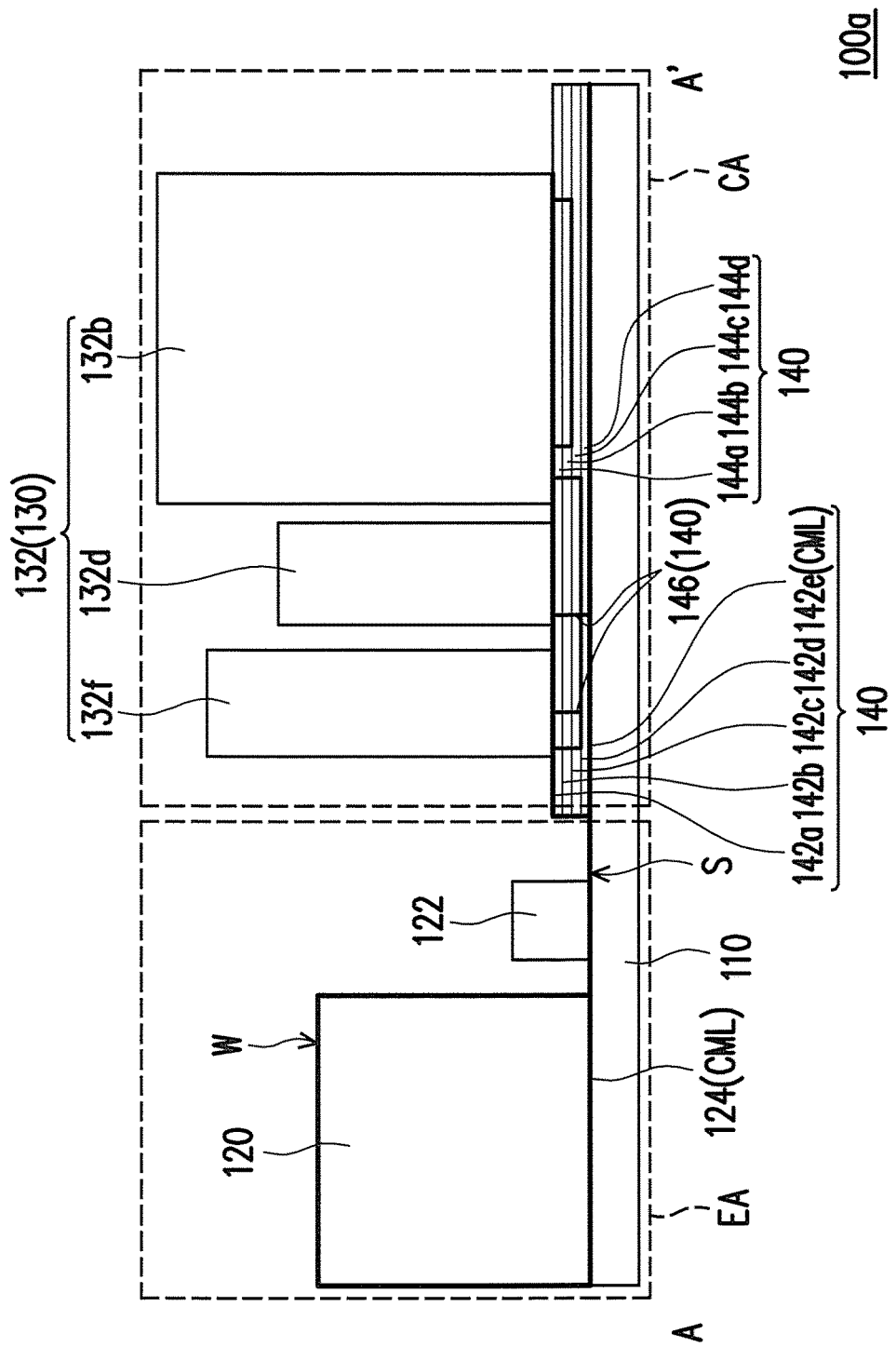
FIG. 1B is a cross-sectional view of the flexible electronic device, taken along the line A-A', in the embodiment of FIG. 1A.
Figure 1C:
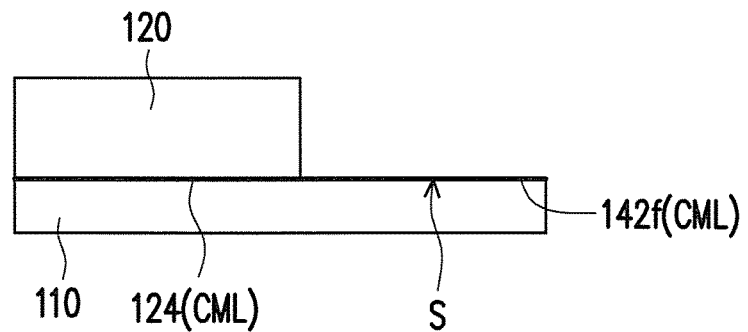
FIG. 1C to FIG. 1F are schematic views showing the fabricating method of the flexible electronic device according to an embodiment of the disclosure.

FIG. 1B is a cross-sectional view of the flexible electronic device, taken along the line A-A', in the embodiment of FIG. 1A. Please refer to FIG. 1A and FIG. 1B. In this embodiment, the flexible electronic device 100a includes a first flexible substrate 110. The first flexible substrate 110 has a surface S. The electronic component 120 and the control device 130 are both disposed on the surface S. In some embodiments, the electronic component 120 and the control device 130 may be respectively disposed on two opposite surfaces of the first flexible substrate 110. Nevertheless, the disclosure is not limited thereto. In addition, in this embodiment, the electronic component 120 and the control device 130 are respectively located in the electronic component area EA and the control device area CA. The electronic component 120 includes a conductive layer 124. The electronic component 120 is disposed on the surface S through the conductive layer 124. The conductive layer 124 is a metal layer in the electronic component 120 where a scan line or a data line that controls the display panel is located, for example. Moreover, the control device 130 includes a circuit layer set 140, and the circuit layer set 140 is disposed between the integrated circuits 132 and the first flexible substrate 110.

In this embodiment, the circuit layer set 140 includes a plurality of circuit layers and at least one first dielectric layer, and at least a portion of the at least one first dielectric layer is interposed between two adjacent circuit layers. The circuit layer set 140 includes a circuit layer 142a, a circuit layer 142b, a circuit layer 142c, a circuit layer 142d, and a circuit layer 142e. The circuit layer set 140 includes a plurality of first dielectric layers, i.e. a first dielectric layer 144a, a first dielectric layer 144b, a first dielectric layer 144c, and a first dielectric layer 144d. In this embodiment, the first dielectric layers and the circuit layers are stacked alternately. The first dielectric layer 144a is interposed between the circuit layer 142a and the circuit layer 142b, the first dielectric layer 144b is interposed between the circuit layer 142b and the circuit layer 142c, the first dielectric layer 144c is interposed between the circuit layer 142c and the circuit layer 142d, and the first dielectric layer 144d is interposed between the circuit layer 142d and the circuit layer 142e. In this embodiment, the first dielectric layer is a flexible material, such that the first dielectric layer may be bent in compliance with the first flexible substrate 110 without being damaged.

In this embodiment, the circuit layer set 140 includes a plurality of conductive through holes 146 that penetrate at least a portion of the first dielectric layer 144a, the first dielectric layer 144b, the first dielectric layer 144c, and the first dielectric layer 144d to communicate with at least a portion of the circuit layer 142a, the circuit layer 142b, the circuit layer 142c, the circuit layer 142d, and the circuit layer 142e. In addition, the integrated circuits 132, e.g. the central processing unit 132b, the RF device 132c, the video signal interface 132d, the touch driving device 132e, and the display driving device 132f of this embodiment, are electrically connected with the conductive through holes 146.

Please continue referring to FIG. 1A and FIG. 1B. In this embodiment, at least a portion of the conductive layer 124 of the electronic component 120 and at least a portion of one circuit layer of the circuit layer set 140 of the control device 130 are integrally formed. The integrated circuits 132 are electrically connected to the electronic component 120 through the circuit layer set 140 and the conductive layer 124. At least a portion of the conductive layer 124 and at least a portion of one circuit layer 142e are integrally formed, and the conductive layer 124 and the circuit layer 142e are both disposed on the first flexible substrate 110. Furthermore, the conductive layer 124 and the circuit layer 142e are an integrally-formed conductive material layer CML. A signal sent by the integrated circuits 132 of the control device 130 may be transmitted to the conductive layer 124 through the circuit layers of the circuit layer set 140 and the conductive through holes 146. The signal may be transmitted into the electronic component 120 through the conductive layer 124. Thereby, the control device 130 is electrically connected to the electronic component 120 and is able to drive the electronic component 120 to operate.

Further, in this embodiment, the electronic component 120 includes a plurality of gate driving devices 122 disposed on the surface S of the first flexible substrate 110 and located in the electronic component area EA. The gate driving devices 122 are connected with the conductive layer 124 and are for providing a gate signal of the display panel in the electronic component 120, so as to drive the display panel. In addition, the electronic component 120 of this embodiment further includes a wire W, wherein an end of the wire W is connected to the conductive layer 124 while another end of the wire W extends to a side of the electronic component 120 that is away from the first flexible substrate 110. For example, the electronic component 120 of this embodiment is provided with a touch panel (not shown), for example. The touch panel is located on the side of the electronic component 120 that is away from the first flexible substrate 110. The touch panel may be electrically connected to the control device 130 by the wire W, such that the control device 130 may drive the touch panel to operate. In an embodiment of the disclosure, the touch panel of the electronic component 120 may be a capacitive touch panel, a resistive touch panel, an optical touch panel, or other types of touch panels. Nevertheless, the disclosure is not limited thereto. Moreover, the wire W may be disposed according to different components of the electronic component 120 so as to connect each component of the electronic component 120 to the conductive layer 124. Nevertheless, the disclosure is not limited thereto.

In this embodiment, the control device 130 is disposed on the surface S of the first flexible substrate 110. The integrated circuits 132 of the control device 130 are electrically connected to the electronic component 120 through the circuit layer set 140 and the conductive layer 124 of the electronic component 120. The conductive layer 124 and the circuit layer 142e of the circuit layer set 140 are both the integrally-formed conductive material layer CML. Hence, the control device 130 does not need to be fabricated on a printed circuit board that cannot be bent. Accordingly, the flexibility of the first flexible substrate 110 allows the electronic component 120 and the control device 130 on the first flexible substrate 110 to be bent in different directions. That is, the flexible electronic device 100a has high degree of freedom of bending ways. In addition, the control device 130 does not need to be electrically connected to the electronic component 120 through a flexible printed circuit board. Thus, the routing between the control device 130 and the electronic component 120 does not need to pass through a flexible printed circuit board, such that the overall circuit routing of the flexible electronic device 100a is simplified. Furthermore, since the flexible electronic device 100a of this embodiment does not rely on a flexible printed circuit board to connect the flexible substrate and the printed circuit board that have completely different flexibilities, the problem that the junctions between the flexible printed circuit board and the printed circuit board and between the flexible printed circuit board and the flexible substrate are relatively weak is prevented. In other words, the flexible electronic device 100a has favorable structural strength.

Figure 1D:
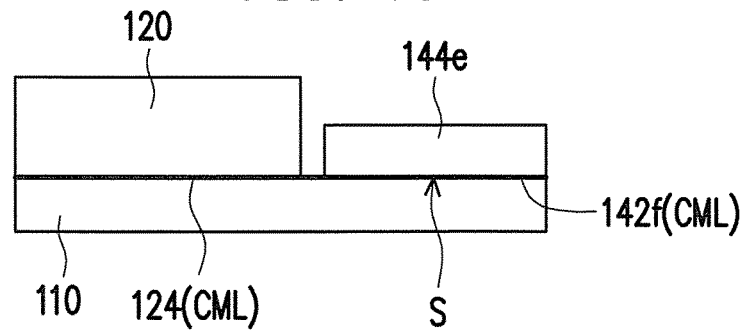
Figure 1E:
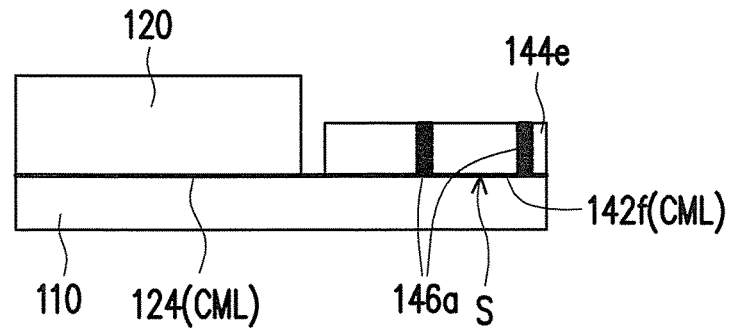
Figure 1F:
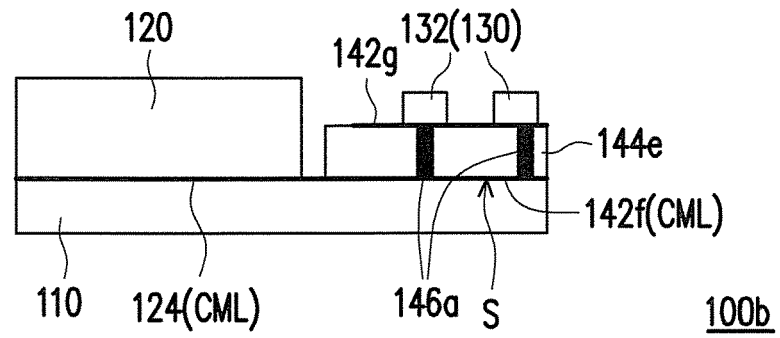

FIG. 1C to FIG. 1F are schematic views showing a fabricating method of the flexible electronic device according to an embodiment of the disclosure. Please refer to FIG. 1C. In this embodiment, a flexible electronic device 100b is similar to the flexible electronic device 100a of the embodiment of FIG. 1A and FIG. 1B. Please refer to the embodiment of the flexible electronic device 100a shown in FIG. 1A and FIG. 1B for details of components of the flexible electronic device 100b and descriptions thereof. The fabricating method of the flexible electronic device 100b includes forming the conductive material layer CML on the surface S of the first flexible substrate 110. The fabricating method of the flexible electronic device 100b also includes forming the electronic component 120 on the surface S. Referring to FIG. 1D, a circuit layer 142f of the circuit layer set of the control device 130 (e.g. the control device 130 as shown in FIG. 1F) and a first dielectric layer 144e are formed. Specifically, a portion of the conductive material layer CML is the conductive layer 124 of the electronic component 120 and another portion of the conductive material layer CML is the circuit layer 142f of the circuit layer set of the control device 130. In some embodiments, a portion of the conductive material layer CML is the conductive layer 124 of the electronic component 120 and another portion of the conductive material layer CML is one of a plurality of circuit layers of the circuit layer set of the control device 130. Nevertheless, the disclosure is not limited thereto.

Referring to FIG. 1E and FIG. 1F, the fabricating method of the flexible electronic device 100b includes forming a plurality of conductive through holes 146a and a circuit layer 142g. The conductive through holes 146a penetrate the first dielectric layer to communicate with the circuit layer 142f and the circuit layer 142g, and the first dielectric layer 144e is interposed between the adjacent circuit layer 142f and circuit layer 142g. Thereafter, the control device 130 is formed on the surface S. The control device 130 includes at least one integrated circuit 132, and the circuit layer set is disposed between the integrated circuit 132 and the first flexible substrate 110. Then, the fabricating method of the flexible electronic device 100b includes electrically connecting the integrated circuit 132 to the conductive through holes 146a, and electrically connecting the integrated circuit 132 of the control device 130 to the electronic component 120 through the circuit layer set and the conductive layer 124, so as to form the flexible electronic device 100b. In some embodiments, the circuit layer set of the control device 130 may also include a plurality of circuit layers and a plurality of first dielectric layers. At least a portion of the first dielectric layers is interposed between two adjacent circuit layers, and the first dielectric layers and the circuit layers are stacked alternately. Moreover, in the above embodiments, a portion of the conductive material layer CML is the conductive layer 124 of the electronic component 120 and another portion of the conductive material layer CML is one of the circuit layers of the circuit layer set of the control device 130. Nevertheless, the disclosure is not limited thereto.

Figure 1G:
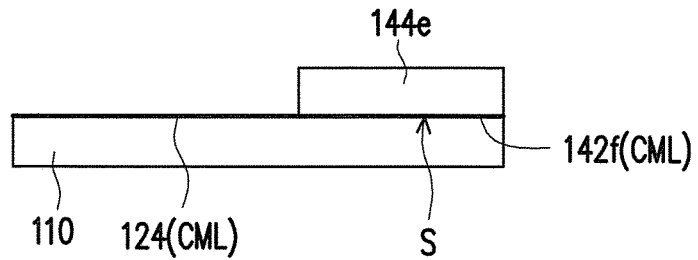
FIG. 1G to FIG. 1J are schematic views showing the fabricating method of the flexible electronic device according to another embodiment of the disclosure.
Figure 1H:
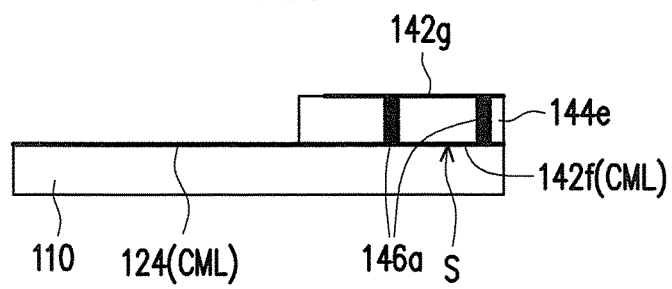
Figure 1I:
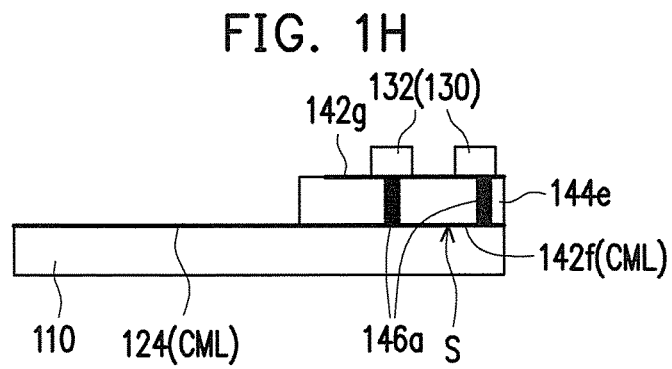
Figure 1J:
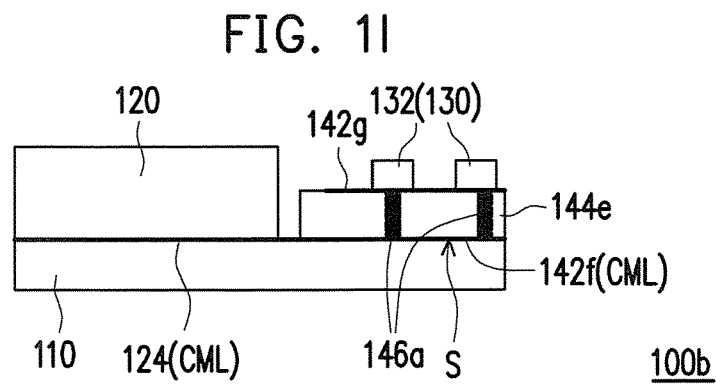

FIG. 1G to FIG. 1J are schematic views showing the fabricating method of the flexible electronic device according to another embodiment of the disclosure. Specifically, FIG. 1G to FIG. 1J illustrate another fabricating method of the flexible electronic device 100b of the embodiment of FIG. 1C to FIG. 1F. Referring to FIG. 1G, in this embodiment, the fabricating method of the flexible electronic device includes the following. The conductive material layer CML is formed on the surface S of the first flexible substrate 110. A portion of the conductive material layer CML is the conductive layer 124 and another portion of the conductive material layer CML is the circuit layer 142f. Then, the first dielectric layer 144e is formed. Thereafter, referring to FIG. 1H and FIG. 1I, a plurality of conductive through holes 146a and the circuit layer 142g are formed and the control device 130 is formed on the surface S. The circuit layer set of the control device 130 is disposed between the integrated circuit 132 of the control device 130 and the first flexible substrate 110. Referring to FIG. 1J, the electronic component 120 is formed on the surface S, and the integrated circuit 132 of the control device 130 is electrically connected to the electronic component 120 through the circuit layer set and the conductive layer 124, so as to form the flexible electronic device 100b.

Figure 1K:
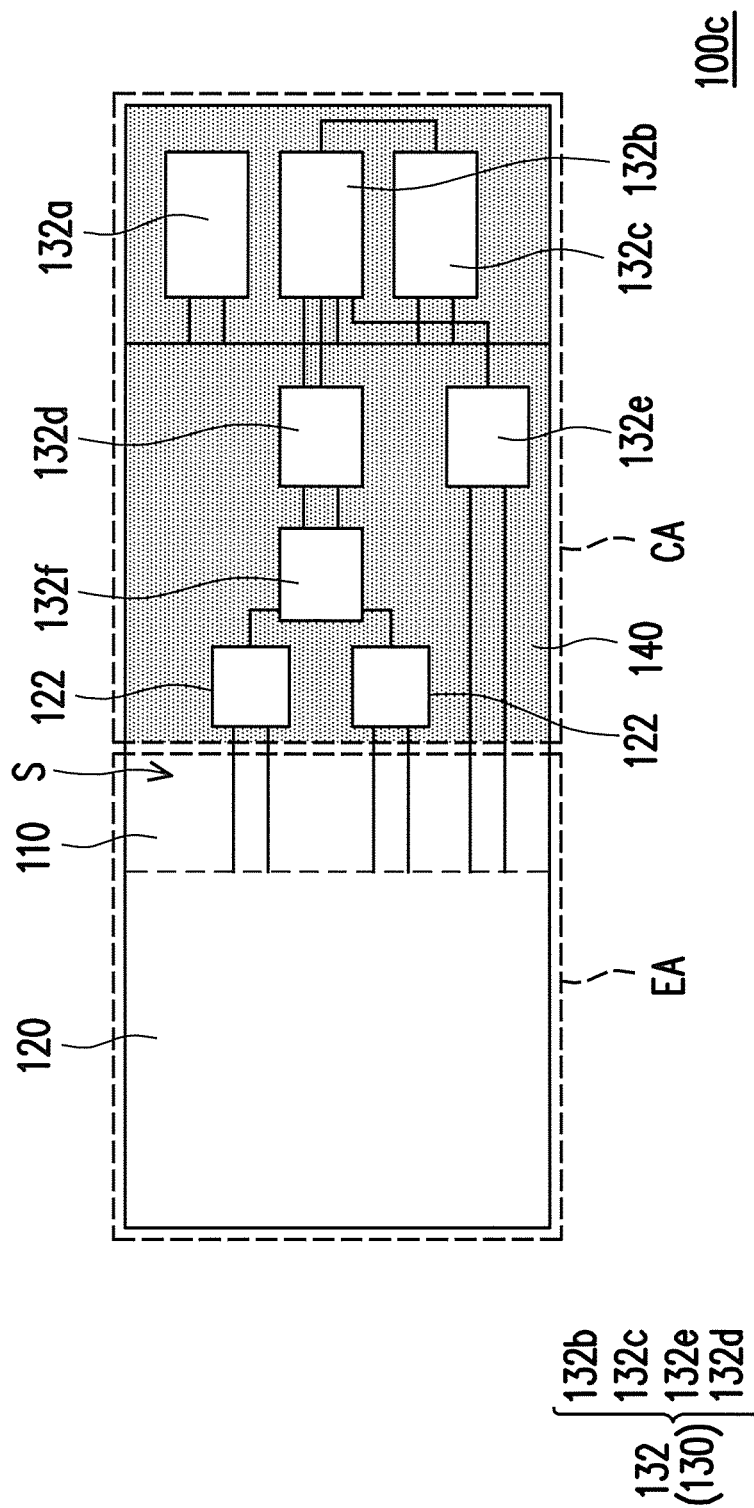
FIG. 1K is a top view of the flexible electronic device according to another embodiment of the disclosure.

FIG. 1K is a top view of the flexible electronic device according to another embodiment of the disclosure. Please refer to FIG. 1K. In this embodiment, a flexible electronic device 100c is similar to the flexible electronic device 100a of the embodiment of FIG. 1A and FIG. 1B. Please refer to the embodiment of the flexible electronic device 100a shown in FIG. 1A and FIG. 1B for details of components of the flexible electronic device 100c and descriptions thereof. Thus, the details are not repeated hereinafter. A difference between the flexible electronic device 100c and the flexible electronic device 100a is that: the gate driving devices 122 of the flexible electronic device 100c are disposed on the circuit layer set 140 and located in the control device area CA. Specifically, like the flexible electronic device 100a of the embodiment of FIG. 1A and FIG. 1B, the circuit of the flexible electronic device 100c is simplified and the structural strength thereof is enhanced, and the flexible electronic device 100c has high degree of freedom of bending ways.

Figure 1L:
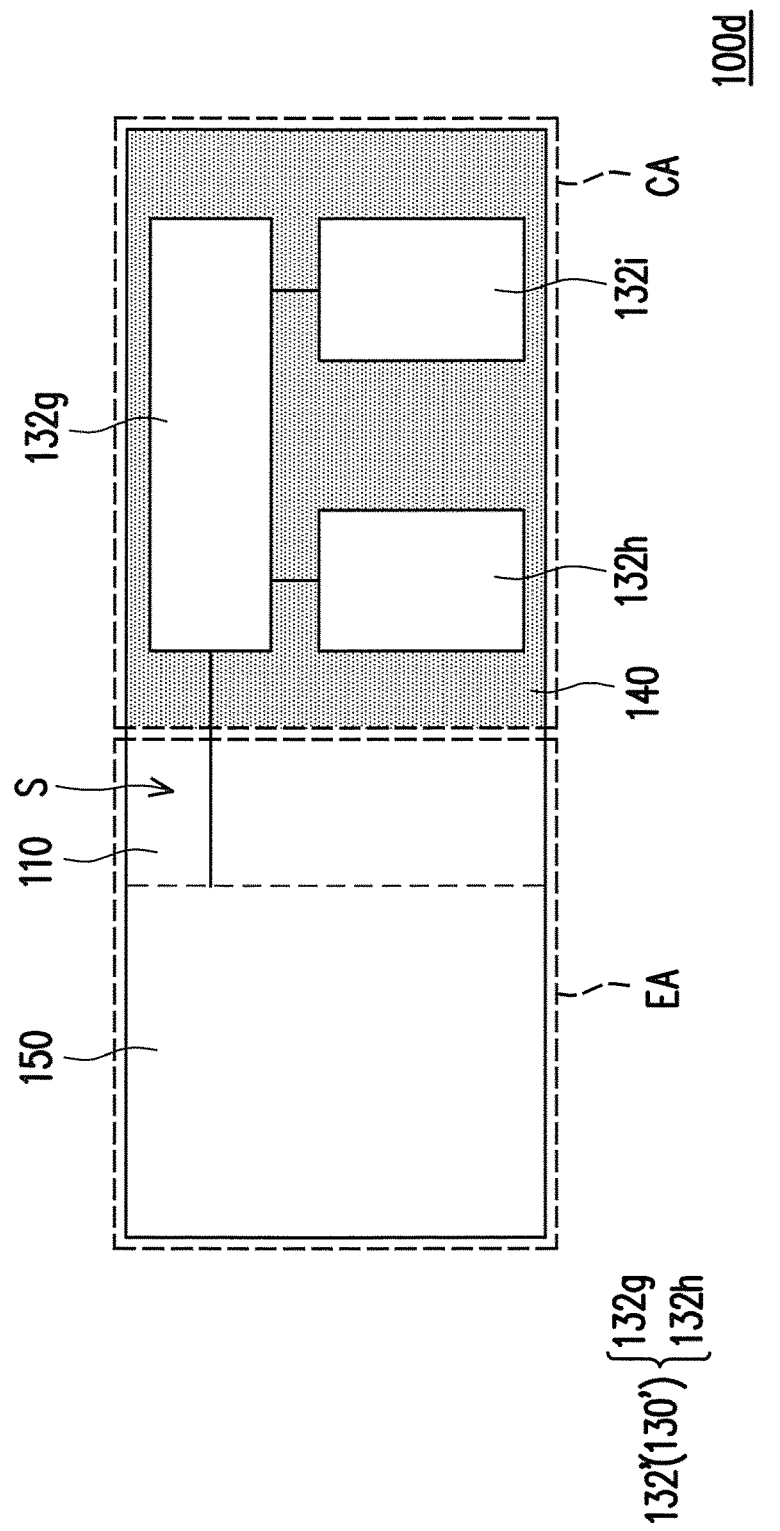
FIG. 1L is a top view of the flexible electronic device according to yet another embodiment of the disclosure.

FIG. 1L is a top view of the flexible electronic device according to yet another embodiment of the disclosure. Please refer to FIG. 1L. In this embodiment, a flexible electronic device 100d is similar to the flexible electronic device 100a of the embodiment of FIG. 1A and FIG. 1B. Please refer to the embodiment of the flexible electronic device 100a shown in FIG. 1A and FIG. 1B for details of components of the flexible electronic device 100d and descriptions thereof. Thus, the details are not repeated hereinafter. A difference between the flexible electronic device 100d and the flexible electronic device 100a is that: the flexible electronic device 100d includes an electronic component 150 and a control device 130'. The electronic component 150 is located in the electronic component area EA and the control device 130' is located in the control device area CA. The electronic component 150 includes a sensor, for example. In this embodiment, the sensor includes a light sensor, a heat sensor, a chemical sensor, or a combination thereof. Nevertheless, the disclosure is not limited thereto. Furthermore, in this embodiment, the control device 130' includes a plurality of integrated circuits 132' for driving and controlling the electronic component 150. The integrated circuits 132' include a driving control device 132g and a signal transmission device 132h. Moreover, a power supply device 132i of the flexible electronic device 100d is disposed in the control device area CA. In this embodiment, the components of the control device 130' are electrically connected as appropriate to drive the electronic component 150 to operate, e.g. a sensing function of the sensor, or to perform other functions of the flexible electronic device 100d. Specifically, like the flexible electronic device 100a of the embodiment of FIG. 1A and FIG. 1B, the circuit of the flexible electronic device 100d is simplified and the structural strength thereof is enhanced, and the flexible electronic device 100d has high degree of freedom of bending ways.

Figure 2A:
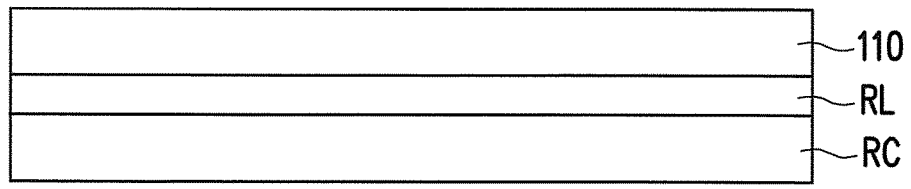
FIG. 2A to FIG. 2L are schematic views showing the method of fabricating the control device on the first flexible substrate according to an embodiment of the disclosure.
Figure 2B:
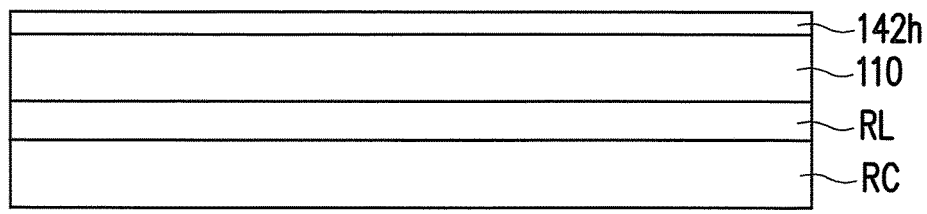
Figure 2C:
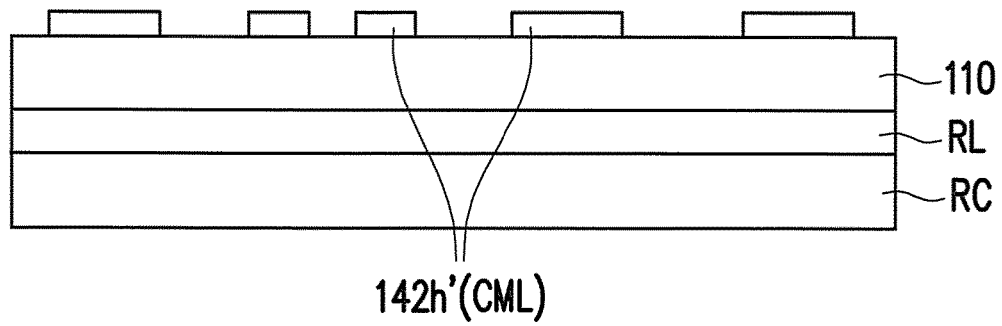
Figure 2D:
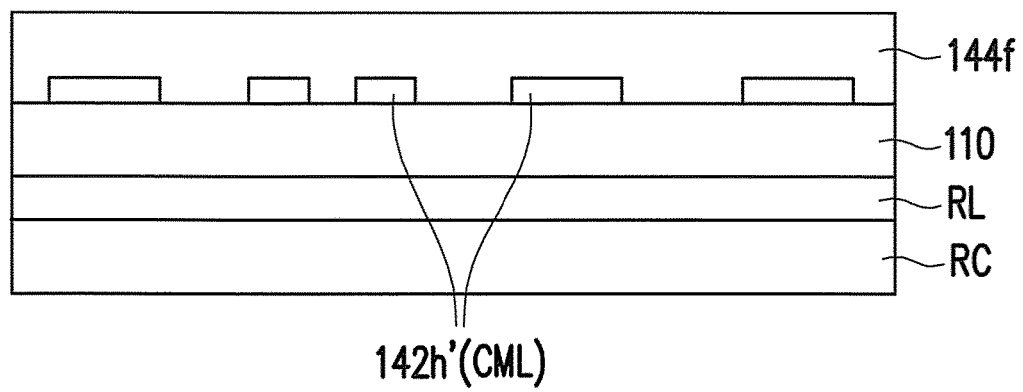
Figure 2E:
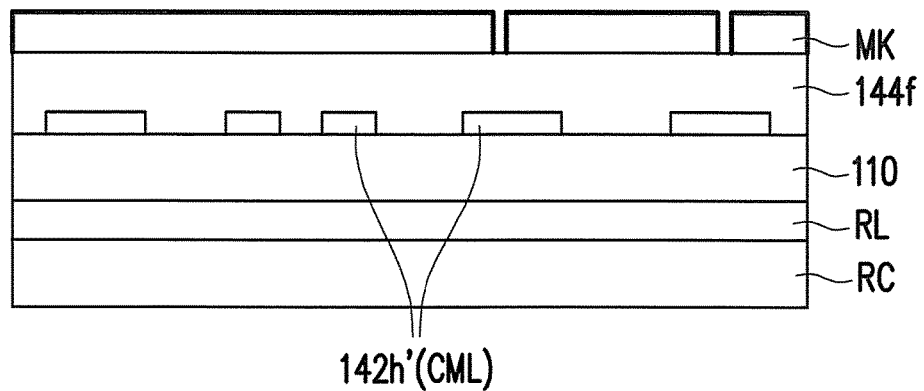
Figure 2F:
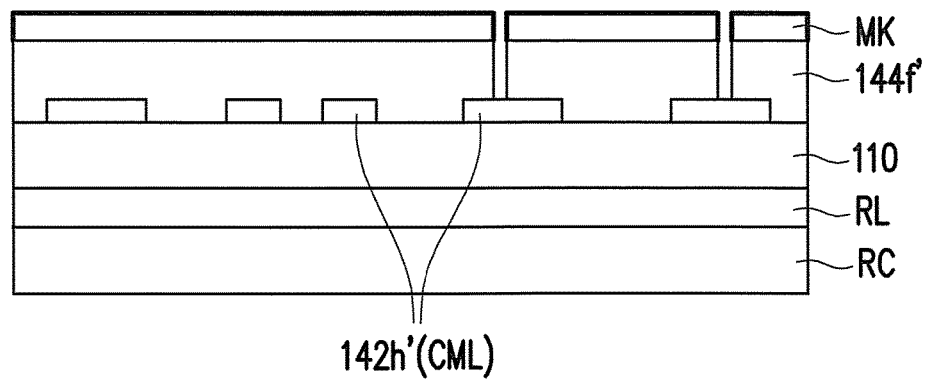
Figure 2G:
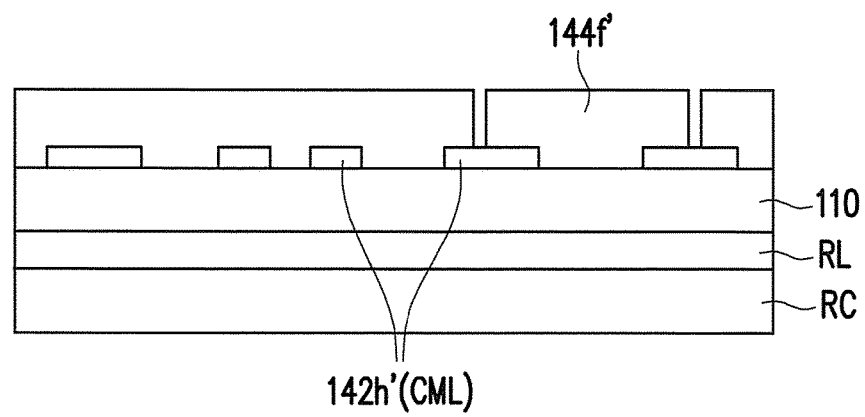
Figure 2H:
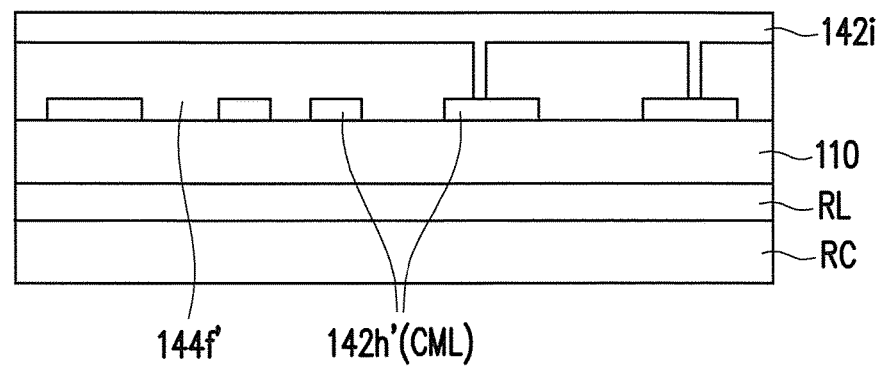
Figure 2I:
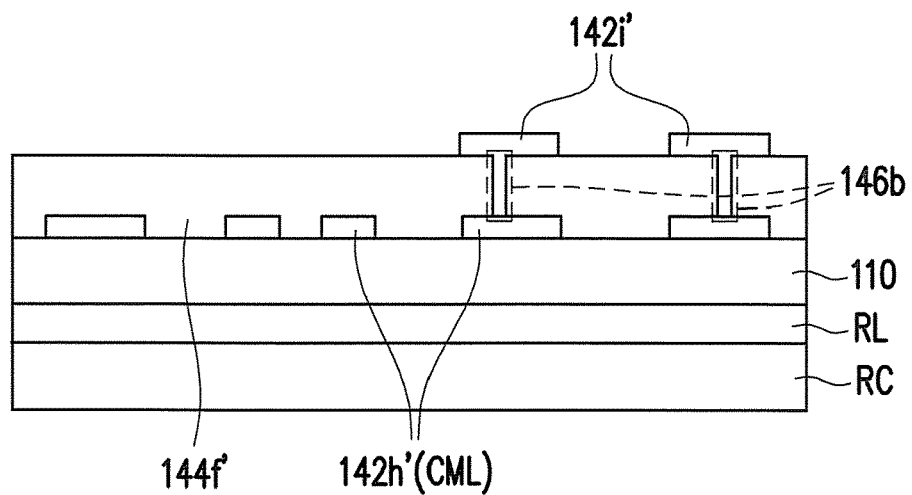

FIG. 2A to FIG. 2L are schematic views showing a method of fabricating the control device on the first flexible substrate according to an embodiment of the disclosure. The method of fabricating the control device on the first flexible substrate described in this embodiment is at least applicable to fabrication of the flexible electronic device 100a of the embodiment of FIG. 1A and FIG. 1B and the flexible electronic device 100b of the embodiment of FIG. 1C to FIG. 1J. Moreover, the method of fabricating the control device on the first flexible substrate described in this embodiment may also be applied to the flexible electronic devices of other embodiments that will be described later and other types of flexible electronic devices. Nevertheless, the disclosure is not limited thereto. In this embodiment, the method of fabricating the control device on the first flexible substrate includes forming the conductive material layer CML on the surface S of the first flexible substrate 110. A method of forming the conductive material layer CML on the surface S of the first flexible substrate 110 includes the following. Referring to FIG. 2A, a de-bonding layer RL is formed on a rigid carrier RC, and the first flexible substrate 110 is formed on the de-bonding layer RL. Referring to FIG. 2B and FIG. 2C, a circuit layer 142h is formed on the surface S of the first flexible substrate 110. The circuit layer 142h is patterned to form a patterned circuit layer 142h' according to the actual conductivity requirements, wherein the circuit layer 142h' is a portion of the conductive material layer CML. The method of forming the conductive material layer CML on the surface S of the first flexible substrate 110 also includes cutting the de-bonding layer RL to remove the de-bonding layer RL and the rigid carrier RC after forming the conductive material layer CML on the surface S. In this embodiment, however, the de-bonding layer RL may be cut to remove the de-bonding layer RL and the rigid carrier RC in other steps of fabricating the control device on the first flexible substrate 110. Nevertheless, the disclosure is not limited thereto.

Referring to FIG. 2D to FIG. 2G, after forming the circuit layer 142h' on the surface S of the first flexible substrate 110, a first dielectric layer 144f is applied on the circuit layer 142h'. A photoresist MK is fabricated on the first dielectric layer 144f, and the first dielectric layer 144f is etched to form a patterned first dielectric layer 144f'. Next, the photoresist MK is removed. Thereafter, referring to FIG. 2H to FIG. 2I, the method of fabricating the control device on the first flexible substrate 110 further includes forming a circuit layer 142i on the first dielectric layer 144f' and patterning the circuit layer 142i to form a patterned circuit layer 142i' according to the actual conductivity requirements. The patterned first dielectric layer 144f' has a plurality of holes. After forming the circuit layer 142i' on the first dielectric layer 144f', the holes are filled with a conductive material to form a plurality of conductive through holes 146b that penetrate the first dielectric layer 144f'. The patterned circuit layer 142i' and at least a portion of the circuit layer 142h' are connected through the conductive through holes 146b.

Figure 2J:
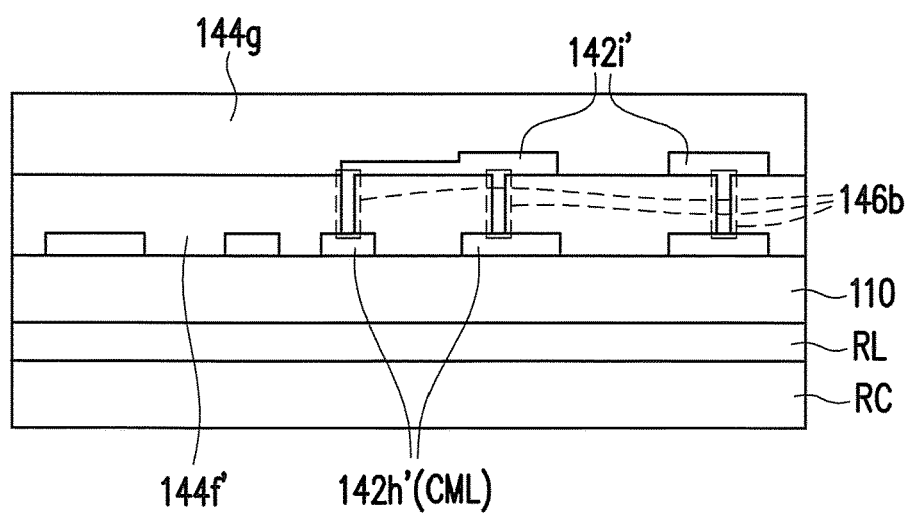
Figure 2K:
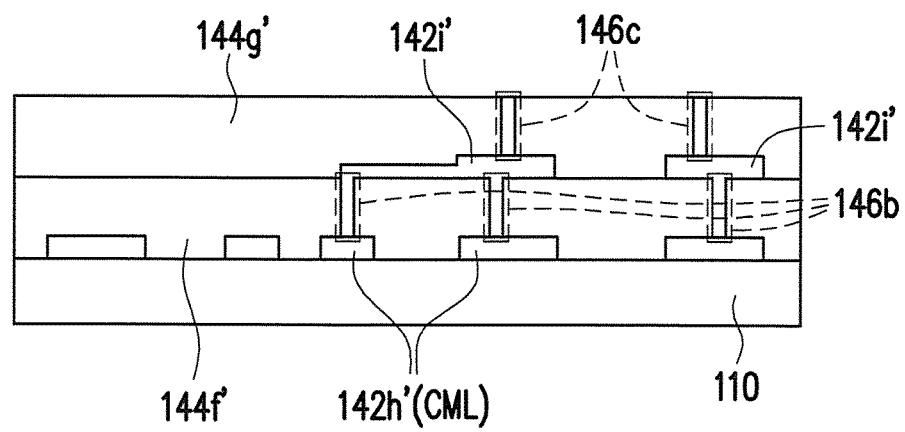
Figure 2L:
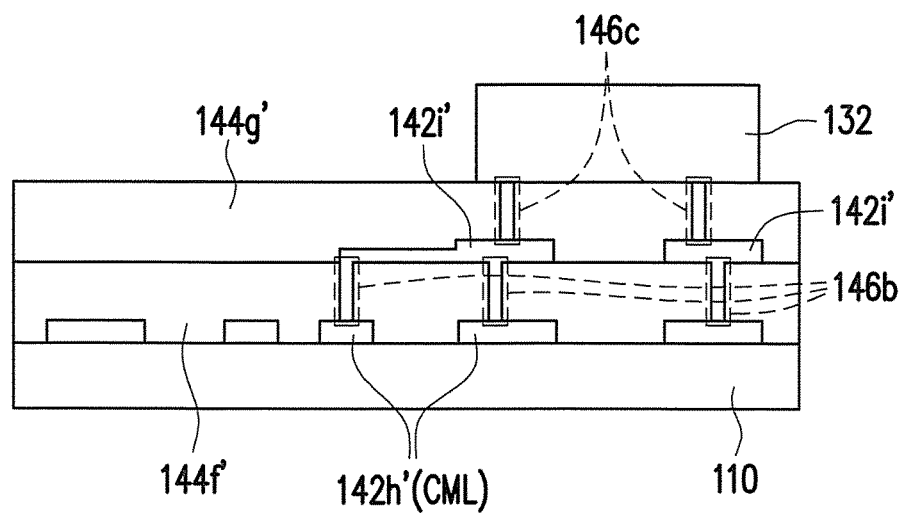

Referring to FIG. 2J to FIG. 2K, a first dielectric layer 144g is formed by a method similar to the method of forming the first dielectric layer 144f, and a patterned first dielectric layer 144g' is formed by a method similar to the method of forming the first dielectric layer 144f'. Then, a plurality of conductive through holes 146c that penetrate the first dielectric layer 144g' are formed by a method similar to the method of forming the conductive through holes 146b. Meanwhile, a circuit layer (not shown) is formed on the first dielectric layer 144g', and the circuit layer and at least a portion of the circuit layer 142i' are connected through the conductive through holes 146c. Thereafter, the de-bonding layer RL is cut to remove the de-bonding layer RL and the rigid carrier RC. In this embodiment, however, the de-bonding layer RL may be cut to remove the de-bonding layer RL and the rigid carrier RC after the control device is fabricated on the first flexible substrate 110. Nevertheless, the disclosure is not limited thereto. Referring to FIG. 2L, the integrated circuit 132 of the control device is formed on the first dielectric layer 144g', and the integrated circuit 132 and the conductive material layer CML are electrically connected.

Figure 3A:
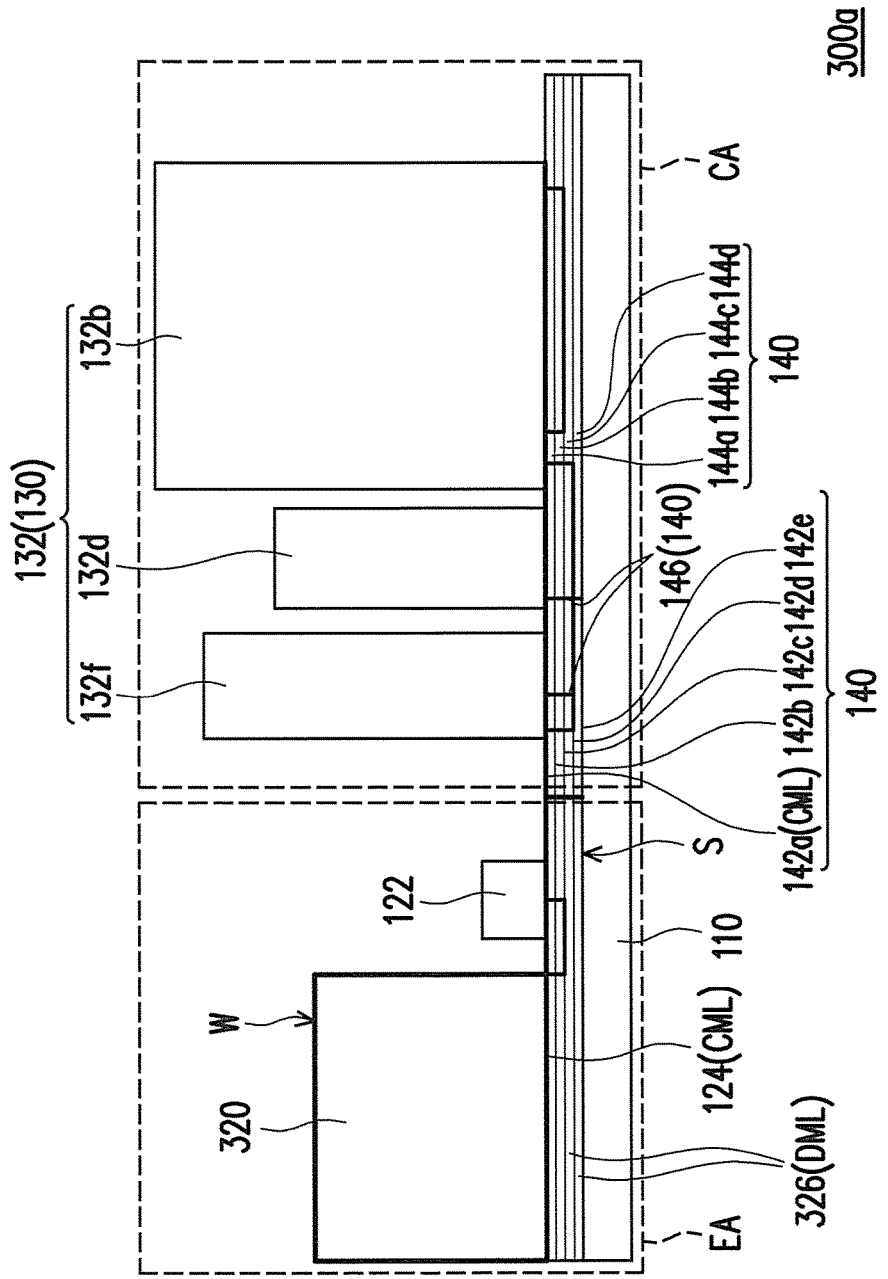
FIG. 3A is a cross-sectional view of the flexible electronic device according to another embodiment of the disclosure.

FIG. 3A is a cross-sectional view of the flexible electronic device according to another embodiment of the disclosure. Please refer to FIG. 3A. In this embodiment, a flexible electronic device 300a is similar to the flexible electronic device 100a of the embodiment of FIG. 1A and FIG. 1B. Please refer to the embodiment of the flexible electronic device 100a shown in FIG. 1A and FIG. 1B for details of components of the flexible electronic device 300a and descriptions thereof. Thus, the details are not repeated hereinafter. A difference between the flexible electronic device 300a and the flexible electronic device 100a is that: an electronic component 320 of the flexible electronic device 300a further includes at least one second dielectric layer, and the electronic component 320 is disposed on the first flexible substrate 110 through the at least one second dielectric layer. The electronic component 320 includes a plurality of second dielectric layers 326, and the electronic component 320 is disposed on the first flexible substrate 110 through the second dielectric layers 326. In this embodiment, the second dielectric layers 326 are disposed between the conductive layer 124 of the electronic component 320 and the first flexible substrate 110. In some embodiments, however, the conductive layer 124 may be disposed between the second dielectric layers 326 and the first flexible substrate 110. Moreover, in other embodiments, the conductive layer 124 may be disposed between two adjacent second dielectric layers 326. Nevertheless, the disclosure is not limited thereto.

In this embodiment, the control device 130 of the flexible electronic device 300a is disposed on the surface S of the first flexible substrate 110. The integrated circuits 132 of the control device 130 are electrically connected to the electronic component 320 through the circuit layer set 140 and the conductive layer 124 of the electronic component 320. The conductive layer 124 and the circuit layer 142a of the circuit layer set 140 are both the integrally-formed conductive material layer CML. Therefore, like the flexible electronic device 100a, the circuit of the flexible electronic device 300a is simplified and the structural strength thereof is enhanced, and the flexible electronic device 300a has high degree of freedom of bending ways.

Figure 3B:
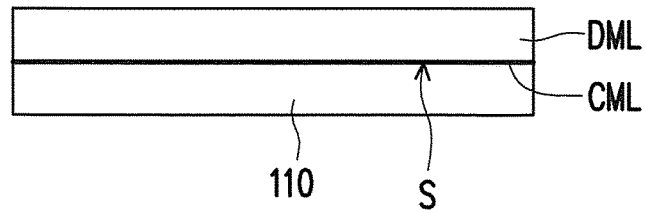
FIG. 3B to FIG. 3E are schematic views showing the fabricating method of the flexible electronic device according to another embodiment of the disclosure.
Figure 3C:
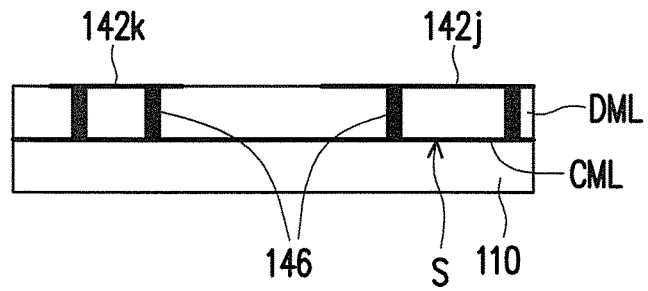
Figure 3D:
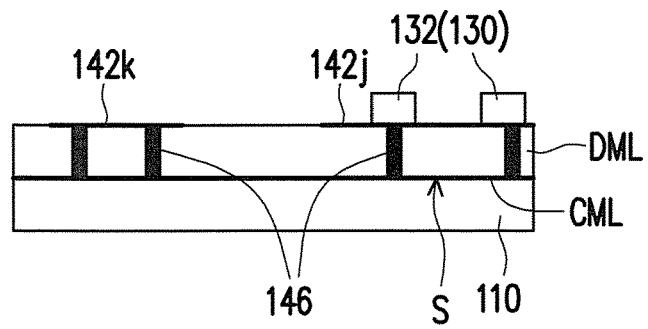
Figure 3E:
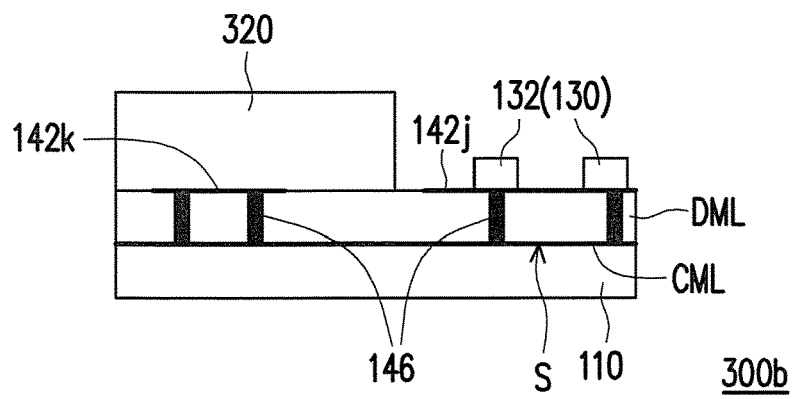

FIG. 3B to FIG. 3E are schematic views showing the fabricating method of the flexible electronic device according to another embodiment of the disclosure. In this embodiment, a flexible electronic device 300b is similar to the flexible electronic device 300a of the embodiment of FIG. 3A. Please refer to the embodiment of the flexible electronic device 300a shown in FIG. 3A for details of components of the flexible electronic device 300b and descriptions thereof. The fabricating method of the flexible electronic device 300b includes the following. Referring to FIG. 3B, the conductive material layer CML is formed on the surface S of the first flexible substrate 110, and a dielectric material layer DML is formed on the conductive material layer CML. Referring to FIG. 3C, a plurality of conductive through holes 146 are formed in the dielectric material layer DML. A circuit layer 142k is formed on a portion of the dielectric material layer DML, and a circuit layer 142j is formed on another portion of the dielectric material layer DML. The circuit layer 142k is connected to a portion of the conductive through holes 146, and the circuit layer 142j is connected to another portion of the conductive through holes 146. The circuit layer 142k is electrically connected to the circuit layer 142j through the conductive through holes 146 and the conductive material layer CML. Referring to FIG. 3D and FIG. 3E, the integrated circuit 132 of the control device 130 is placed or formed on the circuit layer 142j, and the electronic component 320 is fabricated or formed on the circuit layer 142k, so as to form the flexible electronic device 300b. In this embodiment, a portion of the dielectric material layer DML may be deemed as a single-layer second dielectric layer and another portion of the dielectric material layer DML may be deemed as a single-layer first dielectric layer. The electronic component 320 is disposed on the first flexible substrate 110 through the single-layer second dielectric layer. In some embodiments, however, the flexible electronic device 300b may also include a plurality of dielectric material layers DML, wherein a portion of each dielectric material layer DML may be deemed as one second dielectric layer and another portion of each dielectric material layer DML may be deemed as one first dielectric layer. Nevertheless, the disclosure is not limited thereto.

Figure 4A:
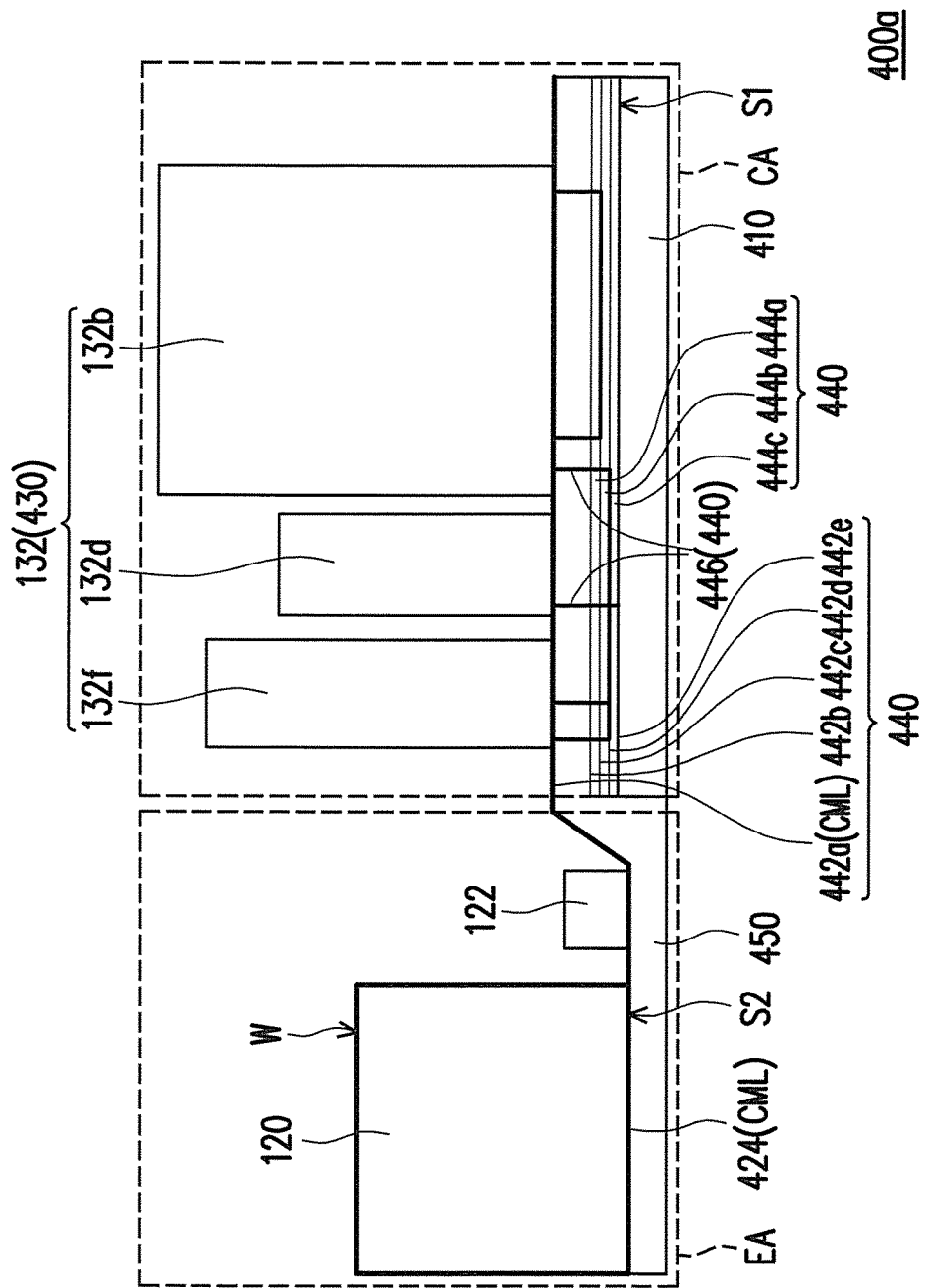
FIG. 4A is a cross-sectional view of the flexible electronic device according to another embodiment of the disclosure.

FIG. 4A is a cross-sectional view of the flexible electronic device according to yet another embodiment of the disclosure. Please refer to FIG. 4A. In this embodiment, a flexible electronic device 400a is similar to the flexible electronic device 100a of the embodiment of FIG. 1A and FIG. 1B. Please refer to the embodiment of the flexible electronic device 100a shown in FIG. 1A and FIG. 1B for details of components of the flexible electronic device 400a and descriptions thereof. Thus, the details are not repeated hereinafter. A difference between the flexible electronic device 400a and the flexible electronic device 100a is that: the flexible electronic device 400a further includes a second flexible substrate 450 disposed between a control device 430 and a circuit layer set 440, and the electronic component 120 is disposed on a surface S2 of the second flexible substrate 450 that faces at least one integrated circuit 132. The circuit layer set 440 includes a plurality of conductive through holes 446 that penetrate at least a portion of at least one first dielectric layer to communicate with at least a portion of the circuit layers and penetrate the second flexible substrate 450 to be electrically connected to the at least one integrated circuit 132. The conductive through holes 446 penetrate at least a portion of a first dielectric layer 444a, a first dielectric layer 444b, and a first dielectric layer 444c to communicate with at least a portion of a circuit layer 442a, a circuit layer 442b, a circuit layer 442c, a circuit layer 442d, and a circuit layer 442e. Moreover, the conductive through holes 446 penetrate the second flexible substrate 450 to be electrically connected to the integrated circuit 132 (the central processing unit 132b, the video signal interface 132d, or the display driving device 132f).

In this embodiment, the control device 430 of the flexible electronic device 400a is disposed on the surface S of the first flexible substrate 410. The integrated circuits 132 of the control device 430 are electrically connected to the electronic component 120 through the circuit layer set 440 and the conductive layer 424 of the electronic component 120. The conductive layer 424 and the circuit layer 442a of the circuit layer set 440 are both the integrally-formed conductive material layer CML. Therefore, like the flexible electronic device 100a, the circuit of the flexible electronic device 400a is simplified and the structural strength thereof is enhanced, and the flexible electronic device 400a has high degree of freedom of bending ways.

Figure 4B:
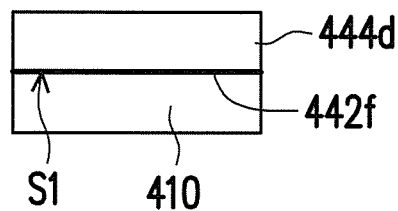
FIG. 4B to FIG. 4F are schematic views showing the fabricating method of the flexible electronic device according to yet another embodiment of the disclosure.
Figure 4C:
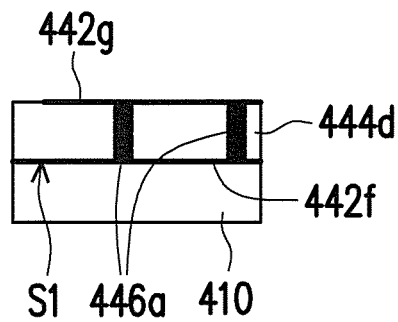

FIG. 4B to FIG. 4F are schematic views showing the fabricating method of the flexible electronic device according to yet another embodiment of the disclosure. In this embodiment, a flexible electronic device 400b is similar to the flexible electronic device 400a of the embodiment of FIG. 4A. Please refer to the embodiment of the flexible electronic device 400a shown in FIG. 4A for details of components of the flexible electronic device 400b and descriptions thereof. The fabricating method of the flexible electronic device 400b includes the following. Referring to FIG. 4B, a circuit layer 442f is formed on a surface S1 of the first flexible substrate 410, and a first dielectric layer 444d is formed on the circuit layer 442f. Referring to FIG. 4C, a plurality of conductive through holes 446a are formed in the first dielectric layer 444d. A circuit layer 442g is formed on the first dielectric layer 444d. The circuit layer 442g is connected with at least a portion of the conductive through holes 446a, and the circuit layer 442g is electrically connected with the circuit layer 442f through the conductive through holes 446a.

Figure 4D:
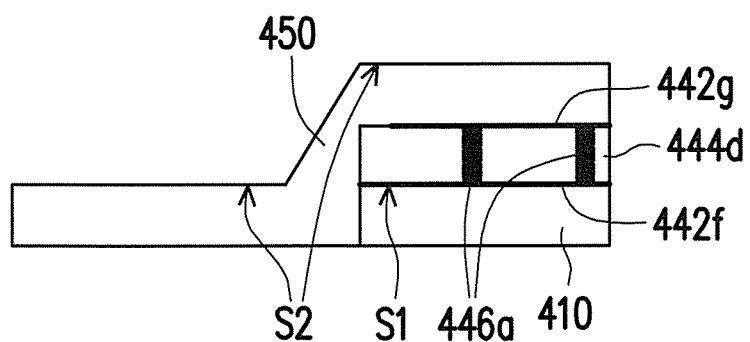
Figure 4E:
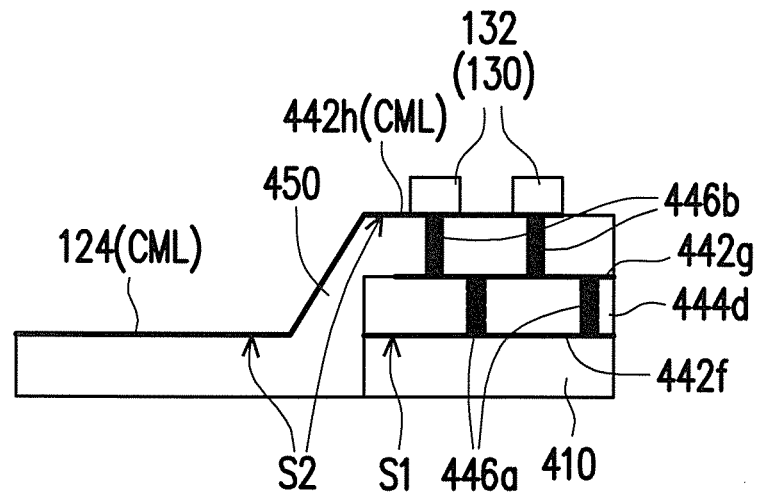
Figure 4F:
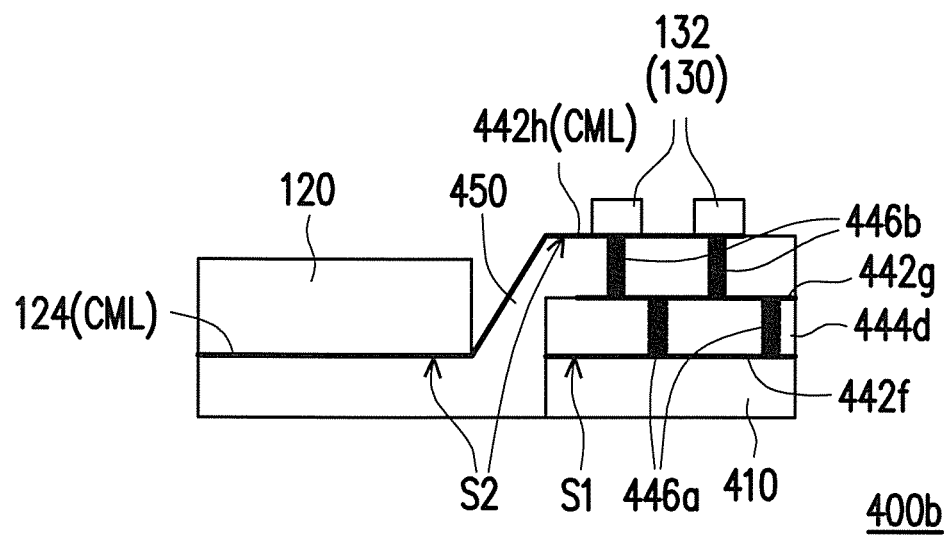

Referring to FIG. 4D and FIG. 4E, the second flexible substrate 450 is formed to cover the circuit layer 442g and a plurality of conductive through holes 446b are formed in the second flexible substrate 450, and the conductive material layer CML is formed on the surface S2 of the second flexible substrate 450 that faces the integrated circuit 132. A portion of the conductive material layer CML is the conductive layer 124 of the electronic component 120 (e.g. the electronic component 120 as shown in FIG. 4F) and another portion of the conductive material layer CML is the circuit layer 442h. The circuit layer 442h corresponds to the position of the first flexible substrate 410 while the conductive layer 124 does not correspond to the position of the first flexible substrate 410. In addition, the integrated circuit 132 of the control device 130 is formed on the second flexible substrate 450.

The conductive through holes 446a penetrate the first dielectric layer 444d and the conductive through holes 446b penetrate the second flexible substrate 450. The conductive through holes 446a and the conductive through holes 446b communicate with the circuit layer 442f, the circuit layer 442g, and the circuit layer 442h. Moreover, the conductive through holes 446a and the conductive through holes 446b are electrically connected to the integrated circuit 132. In some embodiments, however, a plurality of conductive through holes may be formed to penetrate the first dielectric layer 444d, and the conductive through holes penetrate the second flexible substrate 450. In addition, the conductive through holes communicate with at least a portion of the circuit layer 442f, the circuit layer 442g, and the circuit layer 442h and are electrically connected to the integrated circuit 132. Nevertheless, the disclosure is not limited thereto. Referring to FIG. 4F, the electronic component 120 is formed on the surface S2 of the second flexible substrate 450 that faces the integrated circuit 132, so as to form the flexible electronic device 400b. In this embodiment, the electronic component 120 is disposed on the surface S2 through the conductive layer 124.

Figure 5A:
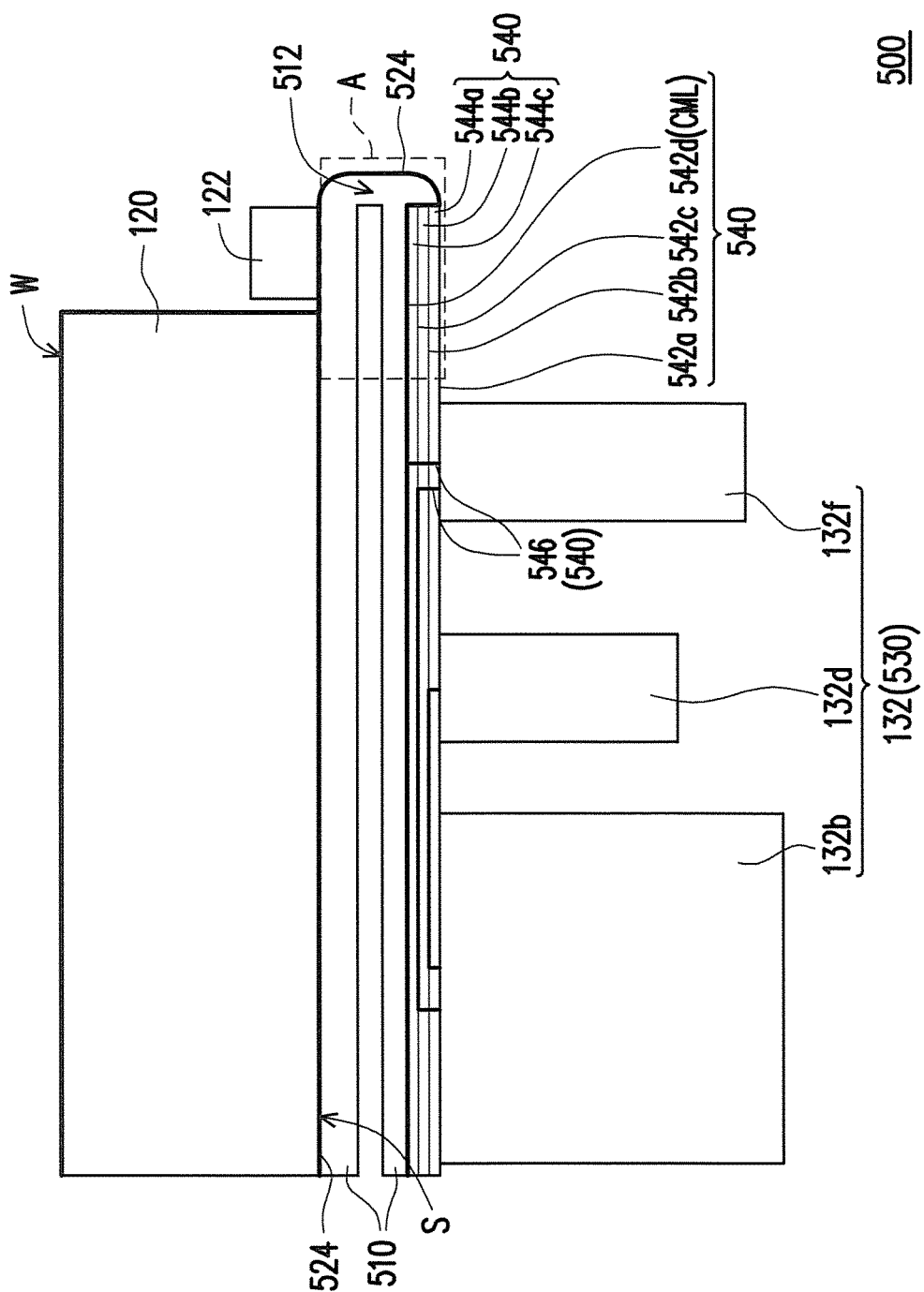
FIG. 5A is a cross-sectional view of the flexible electronic device according to yet another embodiment of the disclosure.

FIG. 5A is a cross-sectional view of the flexible electronic device according to yet another embodiment of the disclosure. Please refer to FIG. 5A. In this embodiment, a flexible electronic device 500 is similar to the flexible electronic device 100a of the embodiment of FIG. 1A and FIG. 1B. Please refer to the embodiment of the flexible electronic device 100a shown in FIG. 1A and FIG. 1B for details of components of the flexible electronic device 500 and descriptions thereof. Thus, the details are not repeated hereinafter. A difference between the flexible electronic device 500 and the flexible electronic device 100a is that: a control device 530 of the flexible electronic device 500 includes a circuit layer set 540, which includes a circuit layer 542a, a circuit layer 542b, a circuit layer 542c, and a circuit layer 542d, and a first dielectric layer 544a, a first dielectric layer 544b, and a first dielectric layer 544c. The first dielectric layers and the circuit layers are stacked alternately. The circuit layer set 540 further includes a plurality of conductive through holes 546. The conductive through holes 546 penetrate at least a portion of the first dielectric layers to communicate with at least a portion of the circuit layers. A first flexible substrate 510 of the flexible electronic device 500 further includes a bent part 512. The bent part 512 is located between the electronic component 120 and the control device 530, and a conductive layer 524 of the electronic component 120 is disposed on the bent part 512. In this embodiment, the bent part 512 is adapted to be bent for folding the first flexible substrate 510.

Figure 5B:
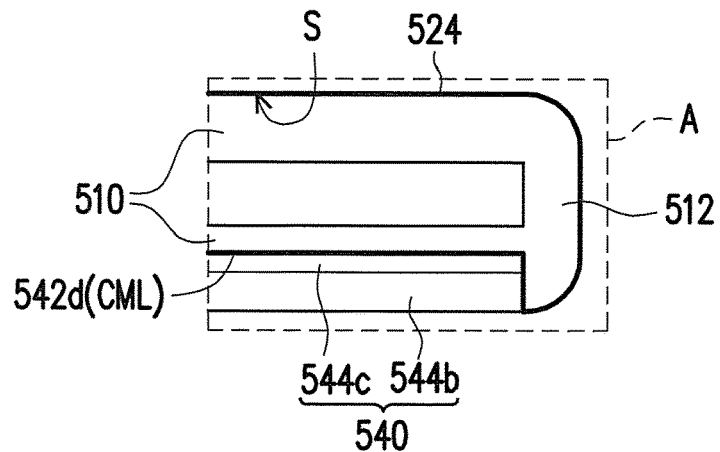
FIG. 5B is an enlarged view of the area A of the flexible electronic device in the embodiment of FIG. 5A.

FIG. 5B is an enlarged view of an area A of the flexible electronic device in the embodiment of FIG. 5A. Please refer to FIG. 5B. In this embodiment, the conductive layer 524 is disposed on the surface S of the first flexible substrate 510 and disposed on a surface of the bent part 512. Meanwhile, the conductive layer 524 and the circuit layer 542d are connected. The control device 530 of the flexible electronic device 500 is disposed on the surface S of the first flexible substrate 510. The integrated circuits 132 of the control device 530 are electrically connected to the electronic component 120 through the circuit layer set 540 and the conductive layer 524 of the electronic component 120. The conductive layer 524 and the circuit layer 542d of the circuit layer set 540 are both the integrally-formed conductive material layer CML. Therefore, like the flexible electronic device 100a, the circuit of the flexible electronic device 500 is simplified and the structural strength thereof is enhanced, and the flexible electronic device 500 has high degree of freedom of bending ways. In addition, the first flexible substrate 510 of the flexible electronic device 500 has the bent part 512, and the integrated circuit 132 of the control device 530 is not located on the bent part 512. Thus, with an appropriate design, the flexible electronic device 500 achieves a favorable bending effect at the bent part 512 and does not cause damage to the control device 530.

Figure 5C:
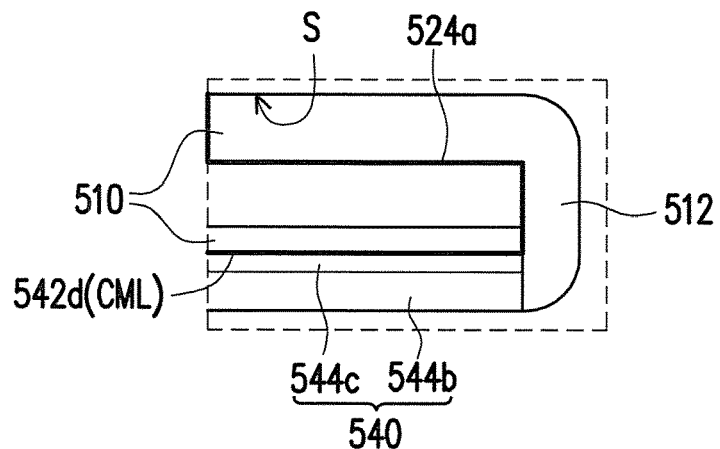
FIG. 5C and FIG. 5D are schematic views showing the structure corresponding to the area A of the flexible electronic device of FIG. 5A according to different embodiments of the disclosure.
Figure 5D:
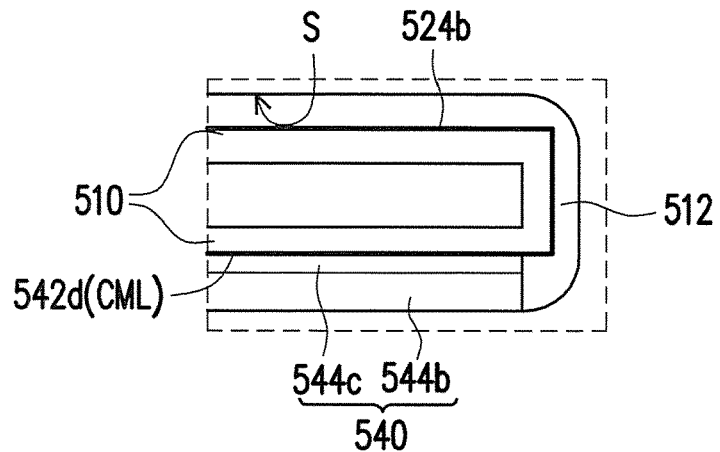

FIG. 5C and FIG. 5D are schematic views showing the structure corresponding to the area A of the flexible electronic device of FIG. 5A according to different embodiments of the disclosure. Referring to FIG. 5C, in this embodiment, a conductive layer 524a extends from the surface S of the first flexible substrate 510 to another surface of the first flexible substrate 510 opposite to the surface S, and the conductive layer 524a is disposed on the surface of the bent part 512. Meanwhile, the conductive layer 524 and the circuit layer 542d are connected. Further, referring to FIG. 5D, in this embodiment, the conductive layer 524a is disposed in the first flexible substrate 510 and disposed in the bent part 512. Meanwhile, the conductive layer 524 and the circuit layer 542d are connected. In these embodiments, with an appropriate design, the flexible electronic devices all achieve a favorable bending effect at the bent part 512 and do not cause damage to the control device.

Figure 6A:
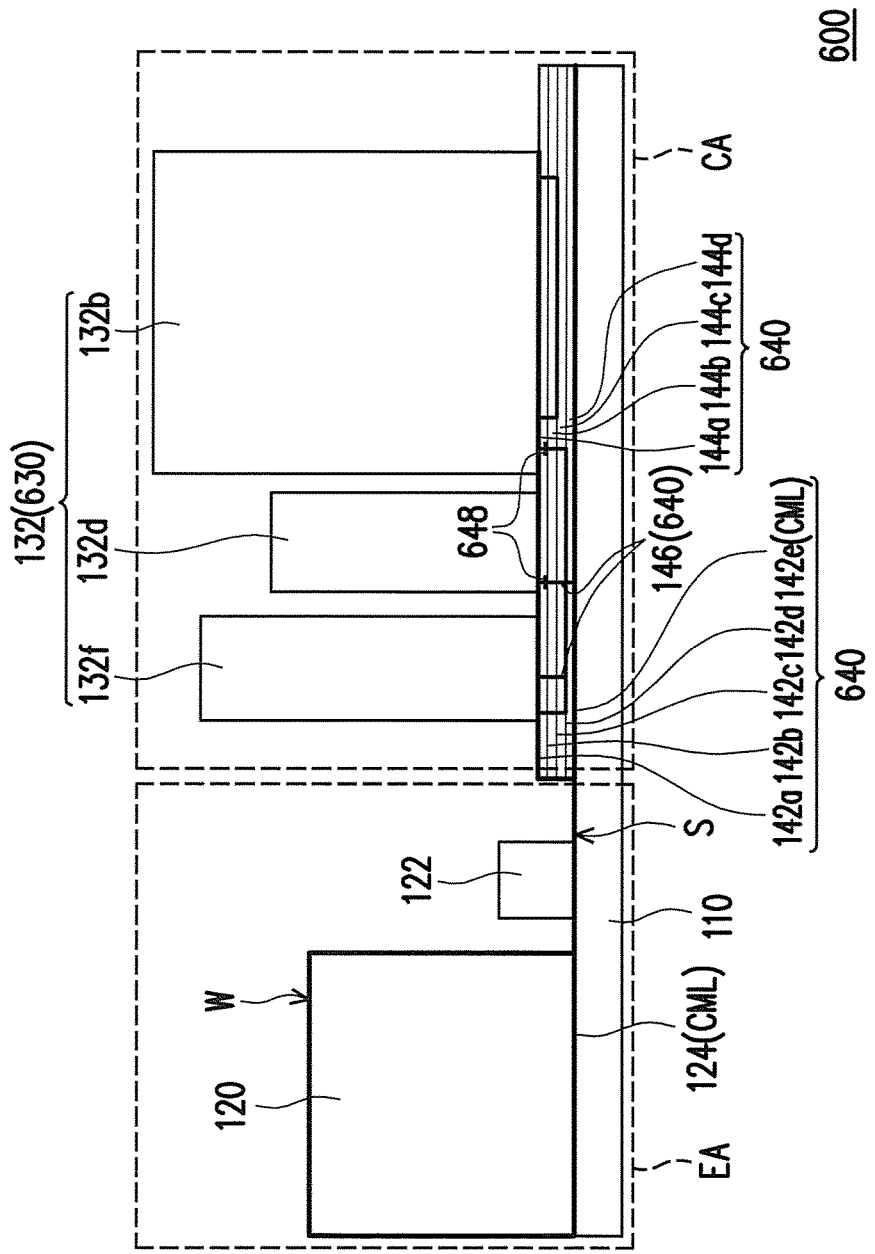
FIG. 6A is a cross-sectional view of the flexible electronic device according to another embodiment of the disclosure.

FIG. 6A is a cross-sectional view of the flexible electronic device according to another embodiment of the disclosure. Please refer to FIG. 6A. In this embodiment, a flexible electronic device 600 is similar to the flexible electronic device 100a of the embodiment of FIG. 1A and FIG. 1B. Please refer to the embodiment of the flexible electronic device 100a shown in FIG. 1A and FIG. 1B for details of components of the flexible electronic device 600 and descriptions thereof. Thus, the details are not repeated hereinafter. A difference between the flexible electronic device 600 and the flexible electronic device 100*a* is that: a circuit layer set 640 of the flexible electronic device 600 further includes a passive device 648 disposed between two adjacent first dielectric layers. The passive device 648 of the circuit layer set 640 of this embodiment is disposed between the first dielectric layer 144*a* and the first dielectric layer 144*b*. Moreover, at least a portion of the conductive through holes 146 and the passive device 648 are electrically connected. In the relevant embodiments, the passive device 648 includes a resistor, a capacitor, or a combination thereof, or the passive device 648 may be other types of passive devices.

Figure 6B:
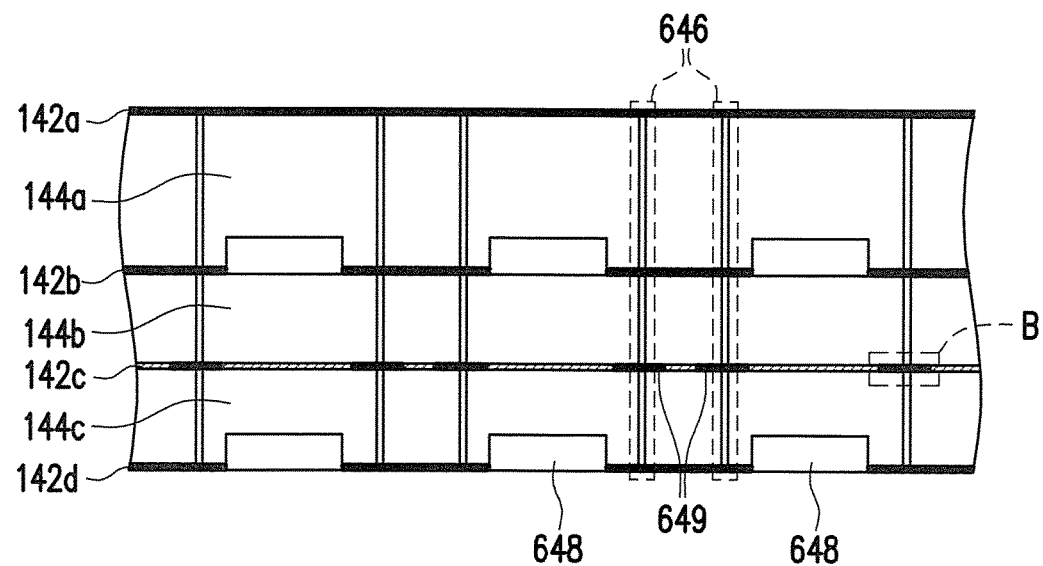
FIG. 6B is a cross-sectional view of a portion of the circuit layer set of the flexible electronic device according to another embodiment of the disclosure.
Figure 6C:
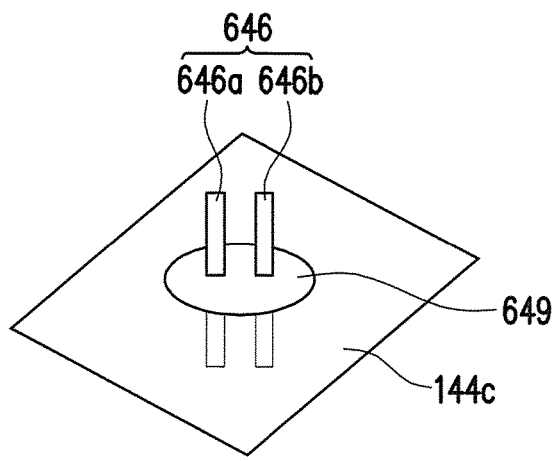
FIG. 6C is an enlarged view of a portion of the circuit layer set in the area B in the embodiment of FIG. 6B.

FIG. 6B is a cross-sectional view of a portion of the circuit layer set of the flexible electronic device according to another embodiment of the disclosure. FIG. 6C is an enlarged view of a portion of the circuit layer set in an area B in the embodiment of FIG. 6B. Please refer to FIG. 6B and FIG. 6C. In this embodiment, the flexible electronic device is similar to the flexible electronic device 600 of the embodiment of FIG. 6A. A difference between the flexible electronic device of this embodiment and the flexible electronic device 600 of the embodiment of FIG. 6A is that: the circuit layer set of the flexible electronic device of this embodiment and the circuit layer set 640 of the flexible electronic device 600 of the embodiment of FIG. 6A have different components. This difference is that: conductive through holes 646 of the circuit layer set of this embodiment are different from the conductive through holes 146 of the embodiment of FIG. 6A. The conductive through holes 646 of this embodiment include a plurality of sub conductive through holes. Each sub conductive through hole penetrates at least a portion of the first dielectric layers, and at least one integrated circuit is electrically connected to the sub conductive through holes. In this embodiment, the conductive through holes 646 include a sub conductive through hole 646*a* and a sub conductive through hole 646*b*. The sub conductive through hole 646*a* and the sub conductive through hole 646*b* penetrate the first dielectric layer 144*a*, the first dielectric layer 144*b*, and the first dielectric layer 144*c*. Moreover, the integrated circuit (not shown) is electrically connected to the sub conductive through hole 646*a* and the sub conductive through hole 646*b*.

In this embodiment, the circuit layer set further includes a plurality of electrodes 649. Each electrode 649 is disposed between two adjacent first dielectric layers, e.g. the adjacent first dielectric layer 144*b* and first dielectric layer 144*c*, that are penetrated by one conductive through hole 646. Moreover, each conductive through hole 646 penetrates one electrode 649. An area of each electrode 649 is larger than a sum of cross-sectional areas of the sub conductive through hole 646*a* and the sub conductive through hole 646*b* in the conductive through hole 646 that penetrates the electrode 649. In addition, the circuit layer set further includes a plurality of shielding layers, and each shielding layer is disposed between two adjacent first dielectric layers. The shielding layer may be disposed between two adjacent first dielectric layers, e.g. the adjacent first dielectric layer 144*b* and first dielectric layer 144*c*, and the shielding layer is located in an area outside the electrodes 649. The shielding layer can prevent interference in signal transmission in the circuit layer set. In this embodiment, since the sub conductive through holes in each conductive through hole 646 are connected to one electrode 649 that has a larger area and the electrode 649 is located between two adjacent first dielectric layers, when the first dielectric layers have a greater relative displacement, the sub conductive through holes remain connected to the electrode 649 and are not easily disconnected. That is, when the flexible electronic device of this embodiment is bent, the conductive through holes 646 are not easily disconnected.

Figure 7A:
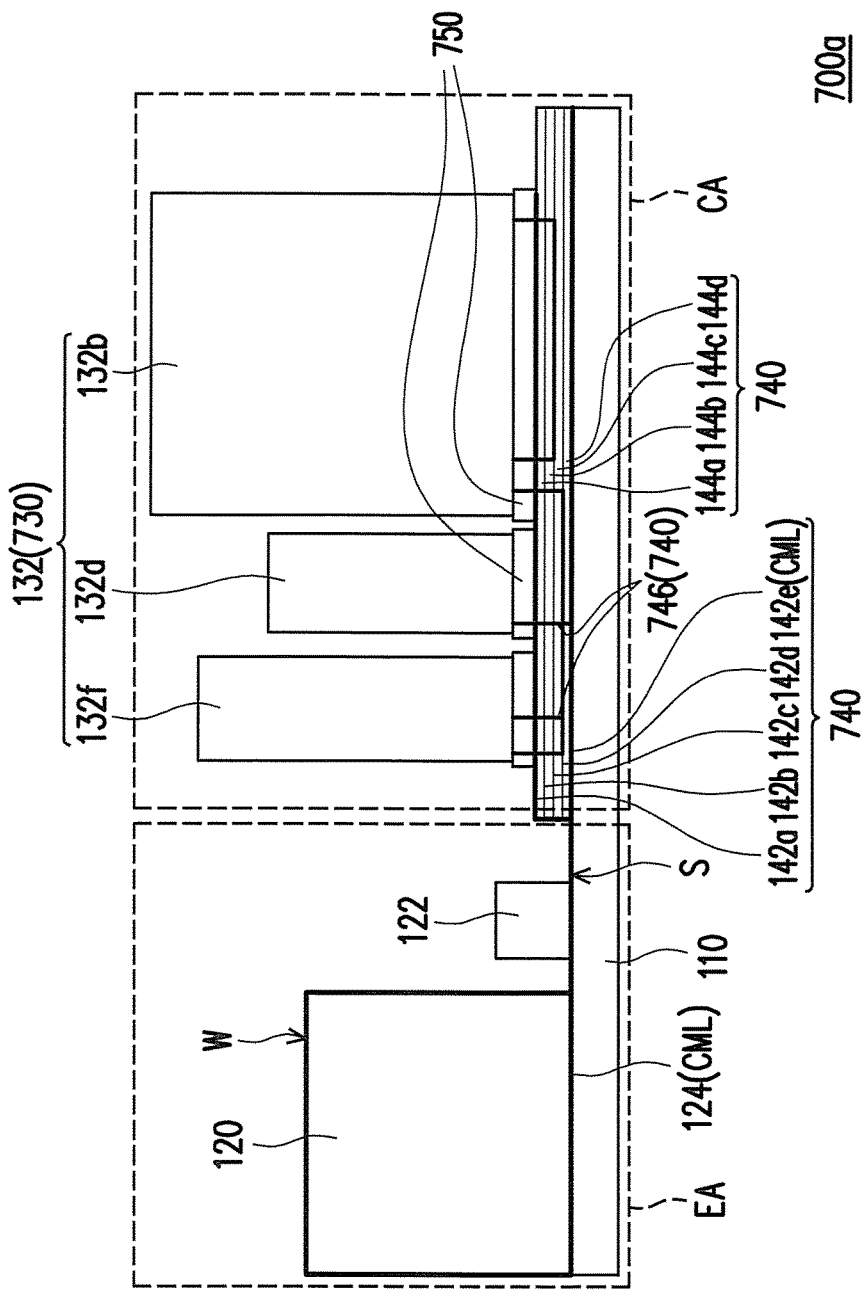
FIG. 7A is a cross-sectional view of the flexible electronic device according to yet another embodiment of the disclosure.

FIG. 7A is a cross-sectional view of the flexible electronic device according to yet another embodiment of the disclosure. Please refer to FIG. 7A. In this embodiment, a flexible electronic device 700*a* is similar to the flexible electronic device 100*a* of the embodiment of FIG. 1A and FIG. 1B. Please refer to the embodiment of the flexible electronic device 100*a* shown in FIG. 1A and FIG. 1B for details of components of the flexible electronic device 700*a* and descriptions thereof. Thus, the details are not repeated hereinafter. A difference between the flexible electronic device 700*a* and the flexible electronic device 100*a* is that: the flexible electronic device 700*a* further includes an interposing layer 750 disposed between at least one integrated circuit 132 and a circuit layer set 740. In this embodiment, the circuit layer set 740 includes a plurality of conductive through holes 746. The conductive through holes 746 penetrate at least a portion of at least one first dielectric layer to communicate with at least a portion of the circuit layers. Specifically, the conductive through holes 746 penetrate at least a portion of the first dielectric layer 144*a*, the first dielectric layer 144*b*, the first dielectric layer 144*c*, and the first dielectric layer 144*d* to communicate with at least a portion of the circuit layer 142*a*, the circuit layer 142*b*, the circuit layer 142*c*, the circuit layer 142*d*, and the circuit layer 142*e*. Moreover, the conductive through holes 746 penetrate the interposing layer 750 and are electrically connected to the integrated circuit 132. In this embodiment, a hardness of the interposing layer 750 is greater than a hardness of the first flexible substrate 110. A material of the interposing layer 750 is PI (polyimide), PET (polyethylene terephthalate), or other materials, for example. In other embodiments, however, the interposing layer 750 may also be other materials. Nevertheless, the disclosure is not limited thereto.

In this embodiment, a control device 730 of the flexible electronic device 700*a* is disposed on the surface S of the first flexible substrate 110. The integrated circuits 132 of the control device 730 are electrically connected to the electronic component 120 through the circuit layer set 740 and the conductive layer 124 of the electronic component 120. The conductive layer 124 and the circuit layer 142*e* of the circuit layer set 740 are both the integrally-formed conductive material layer CML. Therefore, like the flexible electronic device 100*a*, the circuit of the flexible electronic device 700*a* is simplified and the structural strength thereof is enhanced, and the flexible electronic device 700*a* has high degree of freedom of bending ways. Generally, the first flexible substrate 110 and the integrated circuit 132 have a large difference in hardness. If the integrated circuit 132 is disposed on the first flexible substrate 110 directly through the circuit layer set, 740, the wire between the integrated circuit 132 and the circuit layer set 740 may be broken while the flexible electronic device is bent. In contrast thereto, the flexible electronic device 700*a* includes the interposing layer 750 disposed between at least one integrated circuit 132 and the circuit layer set 740 and the hardness of the interposing layer 750 is greater than the hardness of the first flexible substrate 110. Thus, the wire between the integrated circuit 132 and the circuit layer set 740 of the flexible electronic device 700*a* is not easily broken while the flexible electronic device 700*a* is bent.

Figure 7B:
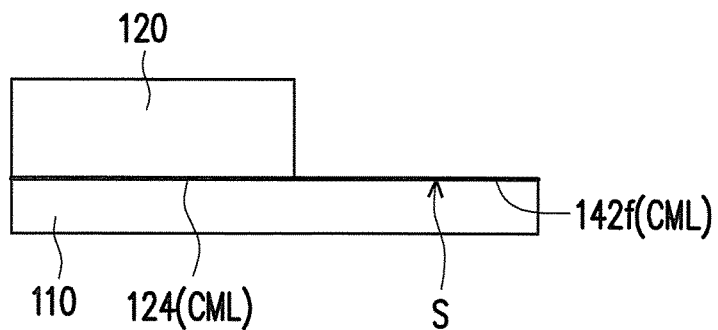
FIG. 7B to FIG. 7F are schematic views showing the fabricating method of the flexible electronic device according to another embodiment of the disclosure.
Figure 7C:
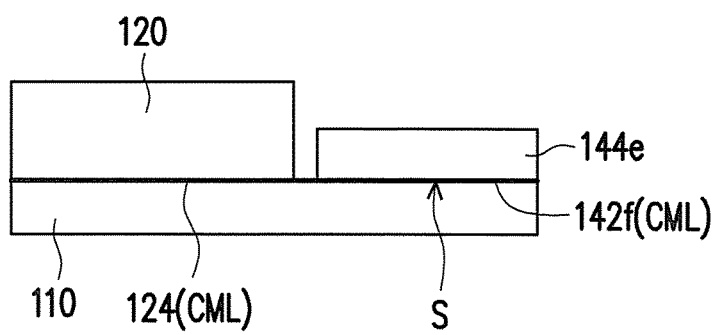
Figure 7D:
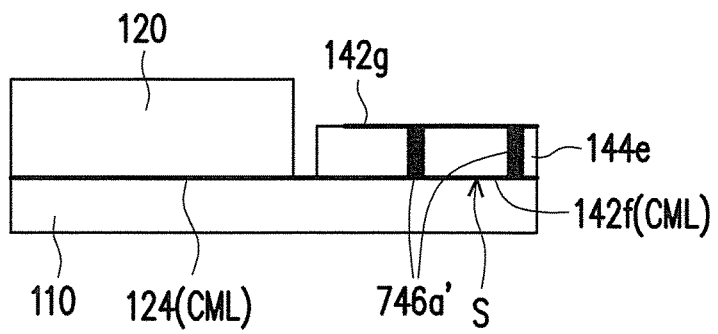
Figure 7E:
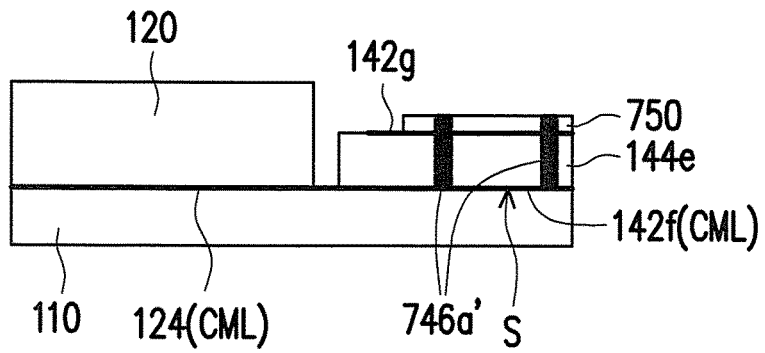
Figure 7F:
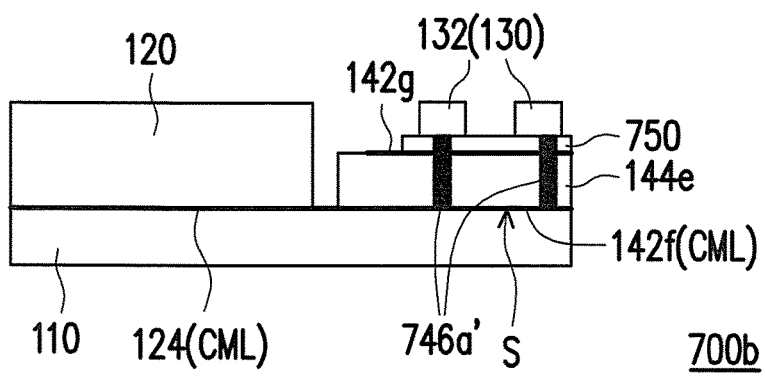

FIG. 7B to FIG. 7F are schematic views showing the fabricating method of the flexible electronic device according to another embodiment of the disclosure. In this embodiment, a flexible electronic device 700*b* is similar to the flexible electronic device 700a of the embodiment of FIG. 7A. Please refer to the embodiment of the flexible electronic device 700a shown in FIG. 7A for details of components of the flexible electronic device 700b and descriptions thereof. The fabricating method of the flexible electronic device 700b includes the following. Referring to FIG. 7B, the conductive material layer CML is formed on the surface S of the first flexible substrate 110. A portion of the conductive material layer CML is the conductive layer 124 and another portion of the conductive material layer CML is the circuit layer 142f of the circuit layer set of the control device 130 (e.g. the control device 130 as shown in FIG. 7F). The electronic component 120 is formed on the surface S. Referring to FIG. 7C to FIG. 7E, the first dielectric layer 144e is formed, and a plurality of conductive through holes 746a' and the circuit layer 142g are formed. Next, the interposing layer 750 is formed on the circuit layer 142g. The conductive through holes 746a' penetrate the interposing layer 750. Thereafter, referring to FIG. 7F, the control device 130 is formed on the surface S, so as to form the flexible electronic device 700b. The control device 130 includes at least one integrated circuit 132. The interposing layer 750 is between the integrated circuit 132 and the circuit layer set, and the hardness of the interposing layer 750 is greater than the hardness of the first flexible substrate 110.

Figure 8A:
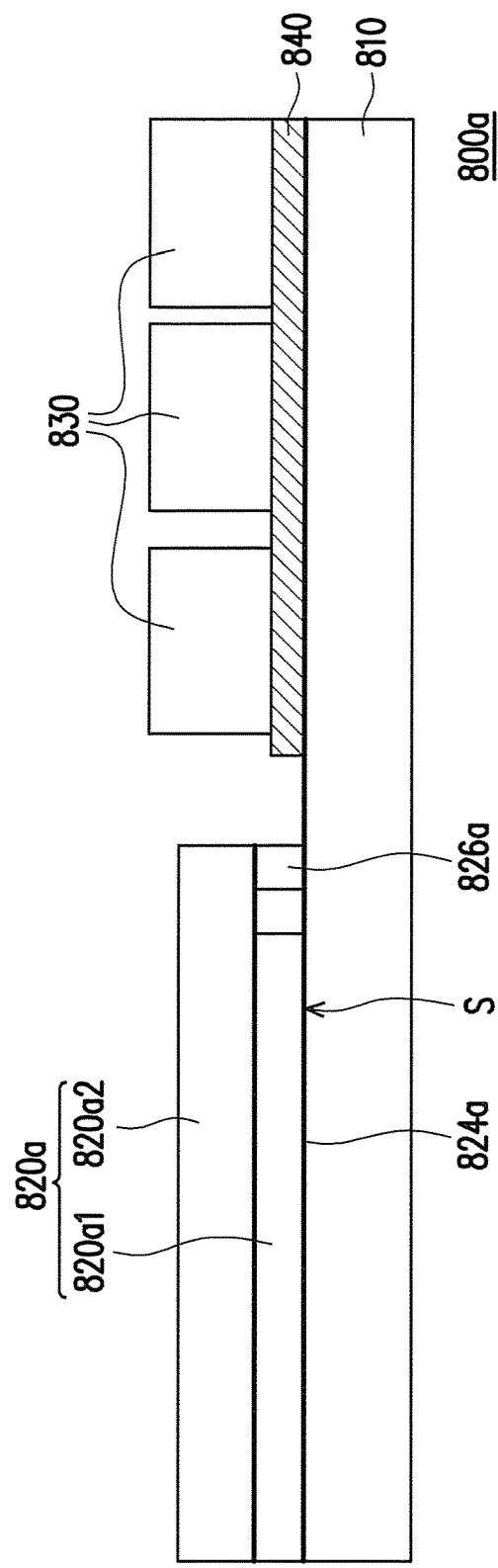
FIG. 8A is a cross-sectional view of the flexible electronic device according to another embodiment of the disclosure.

FIG. 8A is a cross-sectional view of the flexible electronic device according to another embodiment of the disclosure. Please refer to FIG. 8A. In this embodiment, a flexible electronic device 800a is similar to the flexible electronic device 100a of the embodiment of FIG. 1A and FIG. 1B. Please refer to the embodiment of the flexible electronic device 100a shown in FIG. 1A and FIG. 1B for details of components of the flexible electronic device 800a and descriptions thereof. Thus, the details are not repeated hereinafter. The flexible electronic device 800a includes a first flexible substrate 810, an electronic component 820a, and a control device 830. The control device 830 includes at least one integrated circuit and a circuit layer set 840. The first flexible substrate 810, the electronic component 820a, the control device 830, and the circuit layer set 840 are similar to the first flexible substrate 110, the electronic component 120, the control device 130, and the circuit layer set 140 of the embodiment of FIG. 1A and FIG. 1B, respectively. Please refer to the embodiment of FIG. 1A and FIG. 1B for details of components of the first flexible substrate 810, the electronic component 820a, the control device 830, and the circuit layer set 840 and descriptions thereof. Thus, the details are not repeated hereinafter.

In this embodiment, a difference between the flexible electronic device 800a and the flexible electronic device 100a is that: the electronic component 820a of the flexible electronic device 800a includes a first sub electronic component 820a1 and a second sub electronic component 820a2. The first sub electronic component 820a1 is disposed between the second sub electronic component 820a2 and the first flexible substrate 810. The first sub electronic component 820a1 is electrically connected to a conductive layer 824a and the second sub electronic component 820a2 is electrically connected to the conductive layer 824a. In this embodiment, the first sub electronic component 820a1 is an AMOLED display panel and the second sub electronic component 820a2 is a touch panel, for example. The second sub electronic component 820a2 is attached onto a surface of the first sub electronic component 820a1 to provide the electronic component 820a a touch function. In addition, the second sub electronic component 820a2 is electrically connected to the conductive layer 824a through a conductive material 826a. In this embodiment, the conductive material 826a is an ACF (anisotropic conductive film), for example. In other embodiments, however, the conductive material 826a may be other types of conductive materials. Nevertheless, the disclosure is not limited thereto.

Figure 8B:
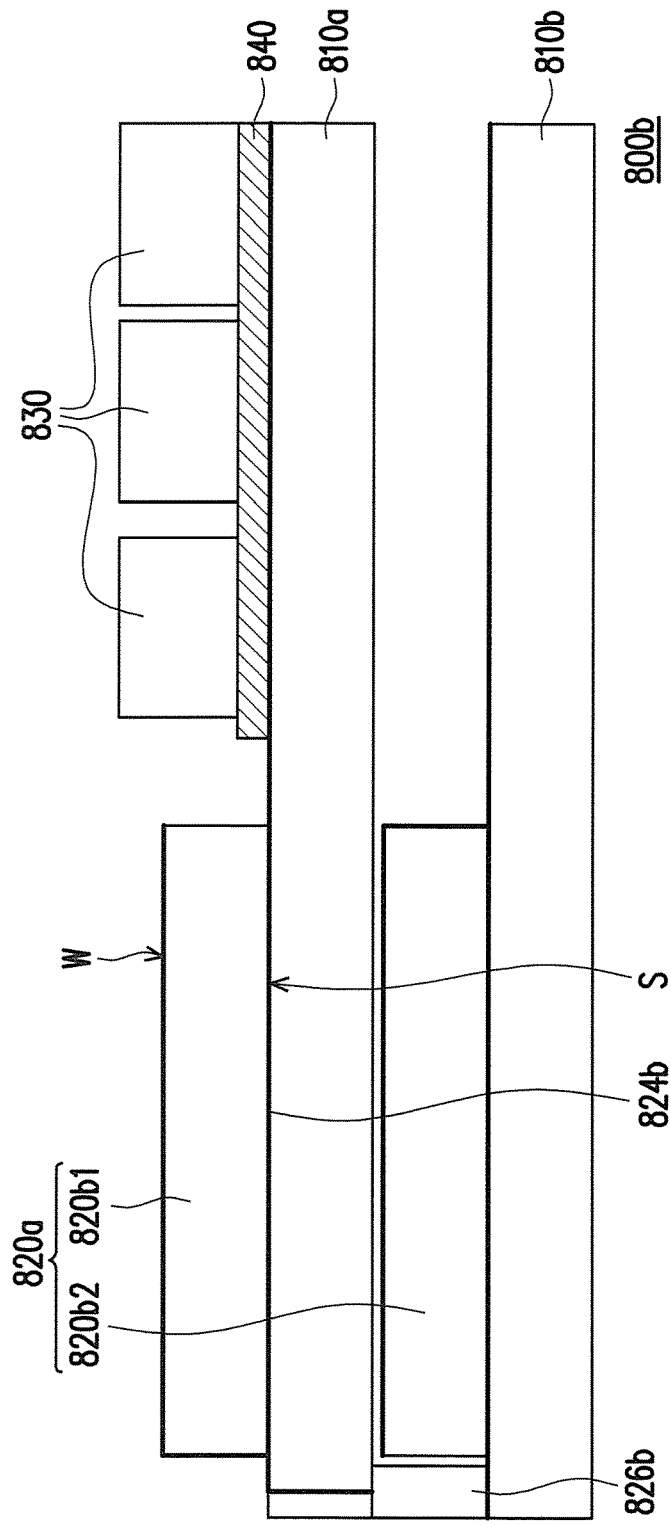
FIG. 8B is a cross-sectional view of the flexible electronic device according to yet another embodiment of the disclosure.

FIG. 8B is a cross-sectional view of the flexible electronic device according to yet another embodiment of the disclosure. Please refer to FIG. 8B. In this embodiment, a flexible electronic device 800b is similar to the flexible electronic device 800a of the embodiment of FIG. 8A. Please refer to the embodiment of the flexible electronic device 800a shown in FIG. 8A for details of components of the flexible electronic device 800b and descriptions thereof. Thus, the details are not repeated hereinafter. A difference between the flexible electronic device 800b and the flexible electronic device 800a is that: the flexible electronic device 800b further includes a second flexible substrate 810b. The electronic component 820a of the flexible electronic device 800b includes a first sub electronic component 820b1 and a second sub electronic component 820b2. In this embodiment, the first sub electronic component 820b1 is disposed on the surface S and the second sub electronic component 820b2 is disposed on the second flexible substrate 810b and disposed between the first flexible substrate 810a and the second flexible substrate 810b. In this embodiment, the first sub electronic component 820b1 is a touch panel and the second sub electronic component 820b2 is an AMOLED display panel, for example. The first sub electronic component 820b1 and the second sub electronic component 820b2 are respectively fabricated on the first flexible substrate 810a and the second flexible substrate 810b. The first flexible substrate 810a is electrically connected to the second flexible substrate 810b through a conductive material 826b. The control device 830 of the flexible electronic device 800b can drive and control the first sub electronic component 820b1 and the second sub electronic component 820b2.

Figure 9:
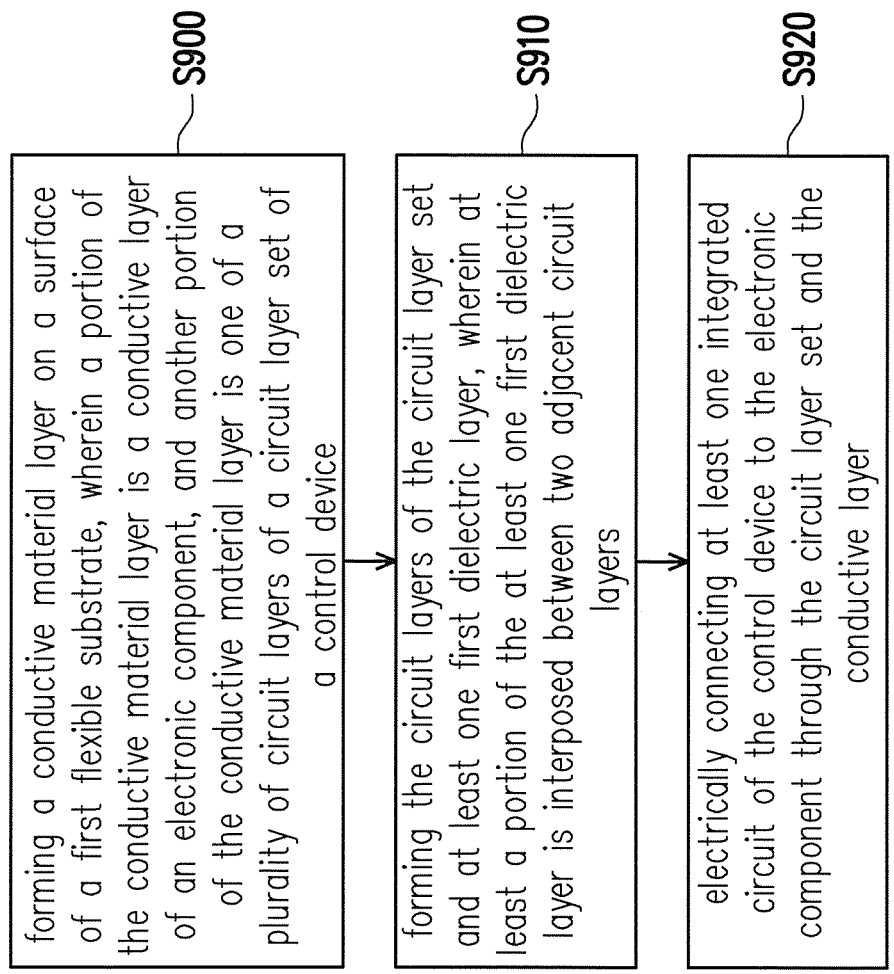
FIG. 9 is a flowchart showing the fabricating method of the flexible electronic device according to an embodiment of the disclosure.

FIG. 9 is a flowchart showing a fabricating method of a flexible electronic device according to an embodiment of the disclosure. Please refer to FIG. 9. The fabricating method of the flexible electronic device is at least applicable to the embodiments of FIG. 1A to FIG. 8B as described above. The fabricating method of the flexible electronic device includes the following. In Step S900, a conductive material layer is formed on a surface of a first flexible substrate. A portion of the conductive material layer is a conductive layer of an electronic component and another portion of the conductive material layer is one of a plurality of circuit layers of a circuit layer set of a control device. In Step S910, the circuit layers of the circuit layer set and at least one first dielectric layer are formed, and at least a portion of the at least one first dielectric layer is interposed between two adjacent circuit layers. In Step S920, at least one integrated circuit of the control device is electrically connected to the electronic component through the circuit layer set and the conductive layer. The fabricating method of the flexible electronic device in the embodiments of the disclosure can be understood sufficiently from the teaching, suggestion, and implementation illustration provided by the description of the embodiments of FIG. 1A to FIG. 8B and thus is not described in further detail.

According to the aforementioned embodiments of the disclosure, the control device is disposed on the surface of the first flexible substrate. At least one integrated circuit of the control device is electrically connected to the electronic component through the circuit layer set and the conductive layer of the electronic component. At least a portion of the conductive layer and at least a portion of one circuit layer of the circuit layer set are integrally formed, and the conductive layer and one circuit layer are both disposed on the first flexible substrate. Therefore, the control device does not need to be fabricated on a printed circuit board that cannot be bent, and the control device does not need to be electrically connected to the electronic component through a flexible printed circuit board. Thereby, the circuit of the flexible electronic device is simplified and the structural strength thereof is enhanced, and the flexible electronic device has high degree of freedom of bending ways.

It will be apparent to those skilled in the art that various modifications and variations can be made to the disclosed embodiments without departing from the scope or spirit of the disclosure. In view of the foregoing, it is intended that the disclosure covers modifications and variations of this disclosure provided that they fall within the scope of the following claims and their equivalents.

What is claimed is:

1. A flexible electronic device, comprising:
   a first flexible substrate having a surface;
   an electronic component comprising a conductive layer; and
   a control device disposed on the surface and comprising:
      at least one integrated circuit; and
      a circuit layer set disposed between the at least one integrated circuit and the first flexible substrate and comprising a plurality of circuit layers and at least one first dielectric layer, wherein at least a portion of the at least one first dielectric layer is interposed between two adjacent circuit layers, and the at least one integrated circuit is electrically connected to the electronic component through the circuit layer set and the conductive layer, wherein the electric component is disposed on the surface through the conductive layer, wherein at least a portion of the conductive layer and at least a portion of one of the circuit layers are integrally formed, and the conductive layer and the one of the circuit layers are both disposed on the first flexible substrate,
   wherein the electronic component further comprises at least one second dielectric layer, and the electronic component is disposed on the first flexible substrate through the at least one second dielectric layer.

2. The flexible electronic device according to claim 1, wherein the circuit layer set comprises a plurality of conductive through holes that penetrate at least a portion of the at least one first dielectric layer to communicate with at least a portion of the circuit layers, and the at least one integrated circuit is electrically connected to the conductive through holes.

3. The flexible electronic device according to claim 2, wherein each of the conductive through holes comprises a plurality of sub conductive through holes, the at least one first dielectric layer is a plurality of first dielectric layers, each of the sub conductive through holes penetrates at least a portion of the first dielectric layers, and the at least one integrated circuit is electrically connected to the sub conductive through holes, wherein the circuit layer set further comprises a plurality of electrodes, each of the electrodes is disposed between two adjacent first dielectric layers penetrated by one of the conductive through holes, each of the conductive through holes penetrates one of the electrodes, and an area of each of the electrodes is larger than a sum of cross-sectional areas of the sub conductive through holes in the conductive through hole that penetrates the electrode.

4. The flexible electronic device according to claim 3, wherein the circuit layer set further comprises a plurality of shielding layers, and each of the shielding layers is disposed between two adjacent first dielectric layers.

5. The flexible electronic device according to claim 2, wherein the at least one first dielectric layer is a plurality of first dielectric layers, and the circuit layer set further comprises a passive device disposed between two adjacent first dielectric layers, wherein at least a portion of the conductive through holes is electrically connected to the passive device.

6. The flexible electronic device according to claim 1, wherein the electronic component comprises a first sub electronic component and a second sub electronic component, wherein the first sub electronic component is disposed between the second sub electronic component and the first flexible substrate, the first sub electronic component is electrically connected to the conductive layer, and the second sub electronic component is electrically connected to the conductive layer.

7. The flexible electronic device according to claim 1, wherein the at least one second dielectric layer is disposed between the conductive layer and the first flexible substrate, or the conductive layer is disposed between the at least one second dielectric layer and the first flexible substrate.

8. The flexible electronic device according to claim 1, wherein the at least one second dielectric layer is a plurality of second dielectric layers, and the conductive layer is disposed between two adjacent second dielectric layers.

9. The flexible electronic device according to claim 1, wherein the first flexible substrate further comprises a bent part located between the electronic component and the control device, and the conductive layer is disposed on the bent part, wherein the bent part is adapted to be bent for folding the first flexible substrate.

10. The flexible electronic device according to claim 1, further comprising an interposing layer disposed between the at least one integrated circuit and the circuit layer set, wherein the circuit layer set comprises a plurality of conductive through holes that penetrate at least a portion of the at least one first dielectric layer to communicate with at least a portion of the circuit layers, and the conductive through holes penetrate the interposing layer and are electrically connected to the at least one integrated circuit, wherein a hardness of the interposing layer is greater than a hardness of the first flexible substrate.

11. The flexible electronic device according to claim 1, wherein the at least one first dielectric layer is made of a flexible material.

12. A flexible electronic device, comprising:
   a first flexible substrate having a surface;
   an electronic component comprising a conductive layer;
   a control device disposed on the surface and comprising:
      at least one integrated circuit;
      a circuit layer set disposed between the at least one integrated circuit and the first flexible substrate and comprising a plurality of circuit layers and at least one first dielectric layer, wherein at least a portion of the at least one first dielectric layer is interposed between two adjacent circuit layers, and the at least one integrated circuit is electrically connected to the electronic component through the circuit layer set and the conductive layer, wherein the electric component is disposed on the surface through the conductive layer, wherein at least a portion of the conductive layer and at least a portion of one of the circuit layers are integrally formed, and the conductive layer and the one of the circuit layers are both disposed on the first flexible substrate; and a second flexible substrate, wherein the electronic component comprises a first sub electronic component and a second sub electronic component, the first sub electronic component is disposed on the surface, the second sub electronic component is disposed on the second flexible substrate, and the second sub electronic component is disposed between the first flexible substrate and the second flexible substrate.

13. A flexible electronic device, comprising:
a first flexible substrate having a surface;
an electronic component comprising a conductive layer;
a control device disposed on the surface and comprising:
at least one integrated circuit;
a circuit layer set disposed between the at least one integrated circuit and the first flexible substrate and comprising a plurality of circuit layers and at least one first dielectric layer, wherein at least a portion of the at least one first dielectric layer is interposed between two adjacent circuit layers, and the at least one integrated circuit is electrically connected to the electronic component through the circuit layer set and the conductive layer, wherein the electric component is disposed on the surface through the conductive layer, wherein at least a portion of the conductive layer and at least a portion of one of the circuit layers are integrally formed, and the conductive layer and the one of the circuit layers are both disposed on the first flexible substrate; and
a second flexible substrate disposed between the at least one integrated circuit and the circuit layer set, wherein the electronic component is disposed on a surface of the second flexible substrate that faces the at least one integrated circuit, wherein the circuit layer set comprises a plurality of conductive through holes that penetrate at least a portion of the at least one first dielectric layer to communicate with at least a portion of the circuit layers, and the conductive through holes penetrate the second flexible substrate and are electrically connected to the at least one integrated circuit.

* * * * *